United States Patent
Okamoto

(10) Patent No.: US 12,284,755 B2
(45) Date of Patent: Apr. 22, 2025

(54) LAMINATE, LAMINATE WITH BUILDUP LAYER, LAMINATE WITH METAL FOIL, AND CIRCUIT BOARD

(71) Applicant: SEKISUI KASEI CO., LTD., Osaka (JP)

(72) Inventor: Koichiro Okamoto, Osaka (JP)

(73) Assignee: SEKISUI KASEI CO., LTD., Osaka (JP)

( * ) Notice: Subject to any disclaimer, the term of this patent is extended or adjusted under 35 U.S.C. 154(b) by 87 days.

(21) Appl. No.: 18/266,627

(22) PCT Filed: Dec. 17, 2020

(86) PCT No.: PCT/JP2020/047204
§ 371 (c)(1),
(2) Date: Jun. 12, 2023

(87) PCT Pub. No.: WO2022/130572
PCT Pub. Date: Jun. 23, 2022

(65) Prior Publication Data
US 2024/0057252 A1    Feb. 15, 2024

(51) Int. Cl.
*H05K 1/03* (2006.01)
*H05K 3/46* (2006.01)

(52) U.S. Cl.
CPC .......... *H05K 1/036* (2013.01); *H05K 3/4655* (2013.01); *H05K 2201/0209* (2013.01); *H05K 2201/0275* (2013.01)

(58) Field of Classification Search
CPC .... H05K 1/036; H05K 1/0366; H05K 1/0373; H05K 2201/0209; H05K 2201/0212;
(Continued)

(56) References Cited

U.S. PATENT DOCUMENTS 4,297,247 A * 10/1981 Krabetz ............... B01J 23/8885
562/534
6,010,768 A * 1/2000 Yasue .................. H05K 3/4661
428/209
(Continued)

FOREIGN PATENT DOCUMENTS

JP      2008-174610 A     7/2008
JP         4566870 B2    10/2010
(Continued)

OTHER PUBLICATIONS

International Search Report and Written Opinion of the International Searching Authority issued in International Patent Application No. PCT/JP2020/047204, dated Jan. 26, 2021, along with an English translation thereof.

*Primary Examiner* — William H. Mayo, III
*Assistant Examiner* — Rhadames Alonzo Miller
(74) *Attorney, Agent, or Firm* — GREENBLUM & BERNSTEIN, P.L.C.

(57) ABSTRACT

There are provided a laminate and the like and a circuit board including the same that exhibit an excellent low dielectric property by a non-conventional new approach. The laminate according to an embodiment of the present invention is a laminate used for a core layer of a circuit board, in which the laminate does not include a buildup layer, the laminate is obtained by laminating a plurality of prepregs including a fiber base material layer and a resin layer (A) so that the prepregs are in direct contact with each other, the resin layer (A) contains an inorganic filler and hollow resin particles, and the hollow resin particles are contained in the resin layer (A) in an amount of 1% by weight to 50% by weight with respect to the total amount of the resin layer (A).

10 Claims, 3 Drawing Sheets

(58) Field of Classification Search
CPC ... H05K 2201/0254; H05K 2201/0275; H05K 3/4655
See application file for complete search history.

(56) References Cited

U.S. PATENT DOCUMENTS

| | | | | |
|---|---|---|---|---|
| 2006/0100314 A1* | 5/2006 | Arifuku | .................. | H01L 24/83 523/210 |
| 2010/0006334 A1* | 1/2010 | Takenaka | ............... | H05K 3/465 174/262 |
| 2010/0143673 A1* | 6/2010 | Mitsukura | .............. | C09J 179/08 156/330 |
| 2010/0295190 A1* | 11/2010 | Mitsukura | .......... | C08G 73/1042 430/286.1 |
| 2011/0121435 A1* | 5/2011 | Mitsukura | .......... | C08G 73/1042 257/632 |
| 2011/0139494 A1* | 6/2011 | Yu | ......................... | H05K 3/107 174/255 |
| 2012/0133061 A1* | 5/2012 | Mitsukura | .............. | C09J 163/00 522/111 |
| 2013/0235545 A1* | 9/2013 | Ohmi | .................. | H05K 1/0237 361/783 |
| 2014/0251656 A1* | 9/2014 | Ikeda | .................. | H05K 1/0373 174/251 |
| 2016/0007460 A1* | 1/2016 | Shimizu | ................. | H05K 1/112 361/783 |
| 2016/0088727 A1* | 3/2016 | Furutani | .............. | H05K 3/4673 174/262 |
| 2017/0267859 A1* | 9/2017 | Uchida | .................... | C08L 63/04 |
| 2017/0342264 A1* | 11/2017 | Jung | .................... | C08K 5/0025 |
| 2018/0054885 A1* | 2/2018 | Takenaka | ............ | H05K 1/0213 |
| 2022/0325126 A1* | 10/2022 | Ono | ...................... | C09D 139/04 |
| 2024/0057253 A1* | 2/2024 | Lee | ...................... | H05K 1/0373 |

FOREIGN PATENT DOCUMENTS

| | | | | |
|---|---|---|---|---|
| JP | 6083127 B2 | 2/2017 | | |
| JP | 2019-90037 A | 6/2019 | | |
| TW | 201229127 A1 | 7/2012 | | |
| WO | WO-2004067638 A1 * | 8/2004 | ............. | C08J 5/244 |
| WO | WO-2019230661 A1 * | 12/2019 | ............. | B32B 15/08 |

* cited by examiner

LAMINATE, LAMINATE WITH BUILDUP LAYER, LAMINATE WITH METAL FOIL, AND CIRCUIT BOARD

TECHNICAL FIELD

The present invention relates to a laminate, a laminate with a buildup layer, a laminate with a metal foil, and a circuit board.

BACKGROUND ART

In recent years, in accordance with increases in information processing volumes and communication speed of various electronic devices, mounting technologies such as high integration of a semiconductor device to be mounted, high density of wiring, and multi-layering have been rapidly developed. An insulating resin material used in a semiconductor member (a semiconductor package or a semiconductor module) used in semiconductor devices is required to be low in a relative dielectric constant and a dielectric loss tangent of an insulating resin, in order to raise the transmission rate of a high frequency signal and reduce a loss during transmission of a signal. For example, an excellent low dielectric property is required for a laminate used for a circuit board, a laminate with a buildup layer, and a laminate with a metal foil.

As one approach to meet such requirements, a technology has been reported in which an excellent low dielectric property is realized by devising a thermosetting resin contained in a thermosetting resin composition for forming a resin layer used for a laminate and the like and a crosslinking agent used in combination therewith (Patent Literature 1).

CITATION LIST

Patent Literature

Patent Literature 1: JP-A-2019-90037

SUMMARY OF INVENTION

Technical Problem

An object of the present invention is to provide a laminate and the like and a circuit board including the same that exhibit an excellent low dielectric property by a non-conventional new approach.

Solution to Problem

A laminate according to an embodiment of the present invention is
 a laminate used for a core layer of a circuit board,
 in which the laminate does not include a buildup layer,
 the laminate is obtained by laminating a plurality of prepregs including a fiber base material layer and a resin layer (A) so that the prepregs are in direct contact with each other,
 the resin layer (A) contains an inorganic filler and hollow resin particles, and
 the hollow resin particles are contained in the resin layer (A) in an amount of 1% by weight to 50% by weight with respect to the total amount of the resin layer (A).
A laminate with a buildup layer according to an embodiment of the present invention includes the laminate according to an embodiment of the present invention, and a buildup layer including a fiber base material layer and a resin layer (B) which is provided on at least one surface of the laminate,
 in which the resin layer (B) contains an inorganic filler and hollow resin particles, and
 the hollow resin particles are contained in the resin layer (B) in an amount of 1% by weight to 50% by weight with respect to the total amount of the resin layer (B).
A laminate with a metal foil according to an embodiment of the present invention is provided, in which the metal foil is formed on at least one surface of the laminate according to an embodiment of the present invention or the laminate with a buildup layer according to an embodiment of the present invention.

A circuit board according to an embodiment of the present invention includes the laminate according to an embodiment of the present invention, the laminate with a buildup layer according to an embodiment of the present invention, or the laminate with a metal foil according to an embodiment of the present invention.

Advantageous Effects of Invention

According to an embodiment of the present invention, it is possible to provide a laminate and the like and a circuit board including the same that exhibit an excellent low dielectric property by a non-conventional new approach.

DESCRIPTION OF EMBODIMENTS

Figure 1:
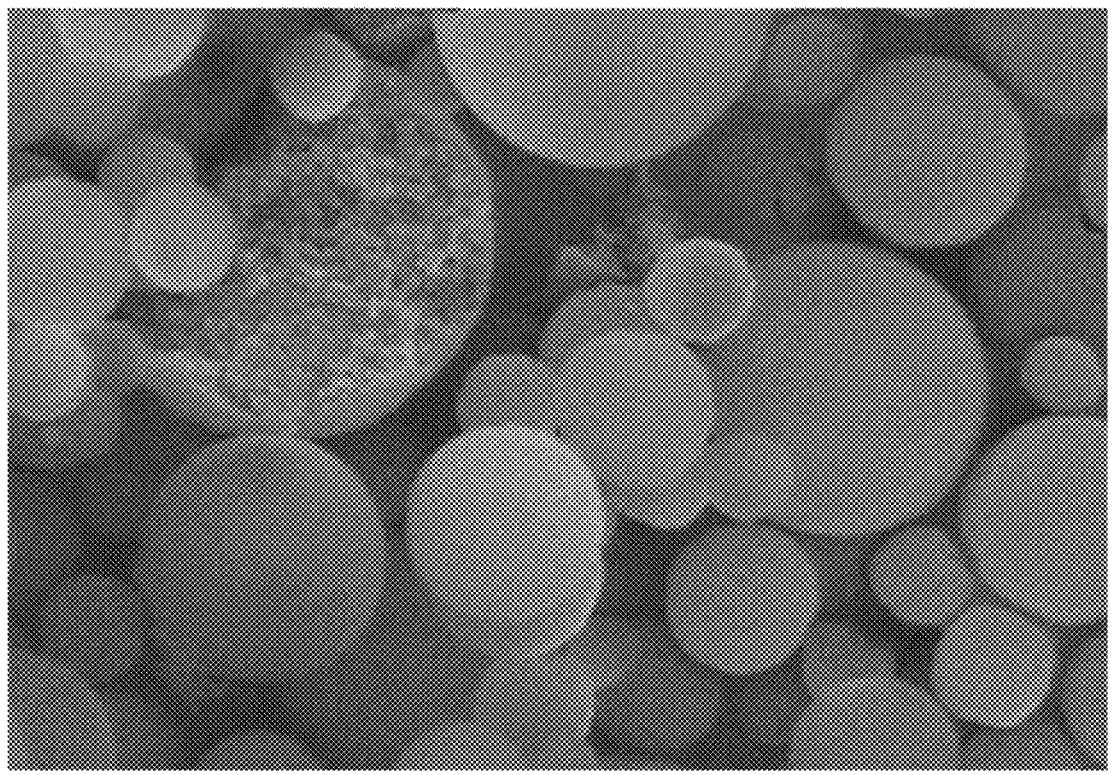
FIG. 1 is a surface SEM image of porous hollow resin particles (1) obtained in Production Example 1.

Hereinafter, embodiments of the present invention will be described, but the present invention is not limited to these embodiments.

In the present specification, the expression "(meth)acryl" means "acryl and/or methacryl", the expression "(meth)acrylate" means "acrylate and/or methacrylate", the expression "(meth)allyl" means "allyl and/or methallyl", and the expression "(meth)acrolein" means "acrolein and/or methacrolein". In addition, in the present specification, the expression "acid (salt)" means "acid and/or salt thereof". Examples of the salt include an alkali metal salt and an alkaline earth metal salt, and specifically, examples of the salt include a sodium salt, a potassium salt, and the like.

A laminate according to an embodiment of the present invention, a laminate with a buildup layer according to an embodiment of the present invention, a laminate with a metal foil according to an embodiment of the present invention, and a circuit board according to an embodiment of the present invention are all members constituting a semiconductor package. In a semiconductor package, typically, a semiconductor element is mounted on a circuit board. The circuit board typically includes a laminate as a core layer, a metal foil provided on at least one surface of the laminate, a buildup layer, a metal foil provided on at least one surface of the buildup layer, and a solder resist layer. Typically, a space between the circuit board and the semiconductor element is underfilled with an underfill. The semiconductor element is typically sealed with a sealing material (a mold resin).

For the descriptions of a member constituting a semiconductor package and a manufacturing method of the same, which are adopted in each of the laminate according to an embodiment of the present invention, the laminate with a buildup layer according to an embodiment of the present invention, the laminate with a metal foil according to an embodiment of the present invention, and the circuit board according to an embodiment of the present invention, the descriptions of the known member constituting a semiconductor package and the manufacturing method of the same can be referred for the contents not described in the present specification. For example, the description described in Japanese Patent No. 6083127 may be referred to.

<<<<<<Laminate>>>>>>

A laminate according to an embodiment of the present invention is a laminate used for a core layer of a circuit board, in which the laminate does not include a buildup layer, and the laminate is obtained by laminating a plurality of prepregs including a fiber base material layer and a resin layer (A) so that the prepregs are in direct contact with each other.

<<<<Fiber Base Material Layer>>>>

The fiber base material layer is a layer obtained by impregnating a fiber base material with a resin composition. The resin composition is preferably a resin composition (a) forming the resin layer (A).

When the laminate includes the fiber base material layer, the laminate can have an excellent low coefficient of linear expansion and an excellent high elastic modulus. Therefore, for example, in a thin multi-layer wiring board or a semiconductor package in which a semiconductor chip is mounted on the multi-layer wiring board, warpage can be reduced, and reliability of heat resistance and thermal shock resistance can be excellent.

As the fiber base material, any appropriate fiber base material can be adopted within a range that does not impair the effect of the present invention. Examples of the fiber base material include a glass fiber base material such as glass cloth; a synthetic fiber base material containing, as a main component, a polybenzoxazole resin fiber, a polyamide-based resin fiber (for example, a polyamide resin fiber, an aromatic polyamide resin fiber, a wholly aromatic polyamide resin fiber, and the like), a polyester-based resin fiber (for example, a polyester resin fiber, an aromatic polyester resin fiber, a wholly aromatic polyester resin fiber, and the like), a polyimide resin fiber, or a fluorine resin fiber; and a paper base material containing, as a main component, kraft paper, cotton linter paper, or a mixed paper of linter and kraft pulp. Among them, a glass fiber base material such as glass cloth is preferable from the viewpoint of strength and water absorption, and glass cloth is more preferable from the viewpoint of being able to reduce a coefficient of thermal expansion of the laminate. Examples of the type of glass include E glass, S glass, NE glass, T glass, UN glass, and quartz glass.

A basis weight of the fiber base material (weight of the fiber base material per 1 m$^2$) is preferably 4 g/m$^2$ to 150 g/m$^2$, more preferably 8 g/m$^2$ to 110 g/m$^2$, still more preferably 12 g/m$^2$ to 60 g/m$^2$, still more preferably 12 g/m$^2$ to 30 g/m$^2$, and particularly preferably 12 g/m$^2$ to 24 g/m$^2$. When the basis weight of the fiber base material is too large out of the above range, impregnation property of the resin composition into the fiber base material is likely to be deteriorated, strand voids and insulation reliability are likely to be deteriorated, and through-holes are hardly formed. When the basis weight of the fiber base material is too small out of the above range, the strength of the fiber base material layer or the prepreg may be reduced.

A coefficient of linear expansion of the fiber base material is preferably 6 ppm/° C. or less and more preferably 3.5 ppm/° C. or less. By using the fiber base material having such a coefficient of linear expansion, warpage of the laminate can be suppressed.

A Young's modulus of the fiber base material is preferably 60 GPa to 100 GPa, more preferably 65 GPa to 92 GPa, and still more preferably 86 GPa to 92 GPa. By using the fiber base material having such a Young's modulus, for example, deformation of the wiring board due to reflow heat during semiconductor mounting can be effectively suppressed.

A dielectric constant of the fiber base material at 1 MHz is preferably 3.8 to 7.0, more preferably 3.8 to 6.8, and still more preferably 3.8 to 5.5. By using the fiber substrate material having such a dielectric constant, a dielectric constant of the substrate can be reduced, and the laminate can be suitable for a semiconductor package using a high-speed signal.

As a thickness of the fiber base material, any appropriate thickness can be adopted within a range that does not impair the effect of the present invention. The thickness of the fiber base material is preferably 5 μm to 100 μm, more preferably 10 μm to 60 μm, and still more preferably 12 μm to 35 μm. By using the fiber base material having such a thickness, handling property at the time of producing the prepreg is further improved, and in particular, warpage of the laminate can be reduced. When the thickness of the fiber base material is too large out of the above range, impregnation property of the resin composition into the fiber base material is likely to be deteriorated, strand voids and insulation reliability are likely to be deteriorated, and through-holes are hardly formed. When the thickness of the fiber base material is too small out of the above range, the strength of the fiber base material layer or the prepreg may be reduced.

As a thickness of the fiber base material layer, any appropriate thickness can be adopted within a range that does not impair the effect of the present invention. Since the fiber base material layer is a layer obtained by impregnating a fiber base material with a resin composition, the thickness of the fiber base material layer can be usually considered as the thickness of the fiber base material. Therefore, the thickness of the fiber base material layer is preferably 5 μm to 100 μm, more preferably 10 μm to 60 μm, and still more preferably 12 μm to 35 μm. By using the fiber base material layer having such a thickness, handling property at the time of producing the prepreg is further improved, and in particular, warpage of the laminate can be reduced. When the thickness of the fiber base material layer is too large out of the above range, impregnation property of the resin composition into the fiber base material is likely to be deteriorated, strand voids and insulation reliability are likely to be deteriorated, and through-holes are hardly formed. When the thickness of the fiber base material layer is too small out of the above range, the strength of the fiber base material layer or the prepreg may be reduced.

The number of fiber base materials used for the fiber base material layer may be one or two or more. When two or more fiber base materials are used, the total thickness of the fiber base materials may be in the range of the preferred thickness of the fiber base material layer.

<<<<Resin Layer (A)>>>>

The resin layer (A) contains an inorganic filler and hollow resin particles. Preferably, the resin layer (A) contains a resin component, an inorganic filler, and hollow resin particles.

The resin layer (A) is formed of a resin composition (a). Typically, the resin layer (A) is formed by curing the resin composition (a). The resin composition (a) typically contains a thermosetting resin, an inorganic filler, and hollow resin particles. The thermosetting resin is cured to become a resin component in the resin layer (A).

The resin composition (a) is typically used as a liquid form in which components contained therein are dissolved and/or dispersed in a solvent such as an organic solvent. Examples of the solvent include organic solvents such as acetone, methyl ethyl ketone, methyl isobutyl ketone, toluene, ethyl acetate, cyclohexane, heptane, cyclohexane, cyclohexanone, tetrahydrofuran, dimethylformamide, dimethylacetamide, dimethylsulfoxide, ethylene glycol, a cellosolve-based solvent, a carbitol-based solvent, anisole, N-methylpyrrolidone, and the like. The solvent may be used alone or in combination of two or more thereof. The amount of the solvent used can be appropriately adjusted according to the purpose.

<<Thermosetting Resin>>

As the thermosetting resin, any appropriate thermosetting resin can be adopted within a range that does not impair the effect of the present invention. The thermosetting resin may be used alone or in combination of two or more thereof. The thermosetting resin may be used in combination with a prepolymer thereof.

A glass transition temperature of the thermosetting resin is preferably 160° C. to 350° C., and more preferably 180° C. to 300° C. By using the thermosetting resin having such a glass transition temperature, lead-free solder reflow heat resistance can be improved.

Examples of the thermosetting resin include a phenol resin such as a novolac-type phenol resin such as a phenol novolac resin, a cresol novolac resin, or a bisphenol A novolac resin, or a resol-type phenol resin such as an unmodified resol phenol resin or an oil-modified resol phenol resin modified with tung oil, linseed oil, or walnut oil; an epoxy resin such as a bisphenol-type epoxy resin such as a bisphenol A-type epoxy resin, a bisphenol F-type epoxy resin, a bisphenol S-type epoxy resin, a bisphenol E-type epoxy resin, a bisphenol M-type epoxy resin, a bisphenol P-type epoxy resin, or a bisphenol Z-type epoxy resin, a novolac-type epoxy resin such as a phenol novolac-type epoxy resin or a cresol novolac-type epoxy resin, a biphenyl-type epoxy resin, a biphenyl aralkyl-type epoxy resin, an arylalkylene-type epoxy resin, a naphthalene-type epoxy resin, an anthracene-type epoxy resin, a phenoxy-type epoxy resin, a dicyclopentadiene-type epoxy resin, a norbornene-type epoxy resin, an adamantane-type epoxy resin, or a fluorene-type epoxy resin; a resin containing a triazine ring such as a urea resin or a melamine resin; an unsaturated polyester resin; a bismaleimide resin; a polyurethane resin; a diallyl phthalate resin; a silicone resin; a resin containing a benzoxazine ring; a cyanate resin; a polyimide resin; a polyamideimide resin; a benzocyclobutene resin; and the like.

From the viewpoint of further exerting the effect of the present invention, the thermosetting resin is preferably at least one selected from the group consisting of a cyanate resin and an epoxy resin.

As the cyanate resin, for example, a cyanate resin obtained by reacting a halogenated cyanide compound with phenols, or a cyanate resin prepolymerized by a method such as heating, as necessary, can be used. Examples of the cyanate resin include a bisphenol-type cyanate resin such as a novolac-type cyanate resin, a bisphenol A-type cyanate resin, a bisphenol E-type cyanate resin, or a tetramethyl bisphenol F-type cyanate resin; a cyanate resin obtained by reacting naphthol aralkyl-type polyvalent naphthol with a cyanogen halide; a dicyclopentadiene-type cyanate resin; and a biphenylalkyl-type cyanate resin. Among these cyanate resins, a novolac-type cyanate resin is preferable from the viewpoint of further exerting the effect of the present invention.

As a weight average molecular weight of the cyanate resin, any appropriate weight average molecular weight can be adopted within a range that does not impair the effect of the present invention. The weight average molecular weight of the cyanate resin is preferably 500 to 4,500, and more preferably 600 to 3,000, from the viewpoint of further exerting the effect of the present invention. The weight average molecular weight can be measured by, for example, gel permeation chromatography (GPC, standard substance: in terms of polystyrene).

When the resin composition (a) contains a cyanate resin, the cyanate resin is contained in the resin composition (a) in an amount of preferably 5% by weight to 90% by weight, more preferably 10% by weight to 80% by weight, and still more preferably 20% by weight to 50% by weight, with respect to the total solid content of the resin composition (a), from the viewpoint of further exerting the effect of the present invention.

Examples of the epoxy resin include a bisphenol-type epoxy resin such as a bisphenol A-type epoxy resin, a bisphenol F-type epoxy resin, a bisphenol E-type epoxy resin, a bisphenol S-type epoxy resin, a bisphenol M-type epoxy resin, a bisphenol P-type epoxy resin, or a bisphenol Z-type epoxy resin; a novolac-type epoxy resin such as a phenol novolac-type epoxy resin or a cresol novolac-type epoxy resin; an arylalkylene-type epoxy resin such as a biphenyl-type epoxy resin, a xylylene-type epoxy resin, or a biphenylaralkyl-type epoxy resin; a phenol aralkyl-type epoxy resin such as a phenol aralkyl-type epoxy resin having a phenylene skeleton or a phenol aralkyl-type epoxy resin having a biphenylene skeleton; a polyfunctional epoxy resin such as a triphenolmethane-type epoxy resin or an alkyl-modified triphenolmethane-type epoxy resin; a naphthalene-type epoxy resin such as a naphthol-type epoxy resin, a naphthalenediol-type epoxy resin, a bi- to tetra-functional epoxy-type naphthalene resin, a naphthylene ether-type epoxy resin, a binaphthyl-type epoxy resin, or a naphthalene aralkyl-type epoxy resin; an anthracene-type epoxy resin; a phenoxy-type epoxy resin; a dicyclopentadiene-type epoxy resin; a norbornene-type epoxy resin; an adamantane-type epoxy resin; a fluorene-type epoxy resin; and a novolac-type epoxy resin having a condensed ring aromatic hydrocarbon structure.

Among the epoxy resins, at least one selected from the group consisting of an arylalkylene-type epoxy resin, a novolac-type epoxy resin having a condensed ring aromatic hydrocarbon structure, and a naphthalene-type epoxy resin is preferable from the viewpoint of further exerting the effect of the present invention.

The arylalkylene-type epoxy resin is an epoxy resin having one or more arylalkylene groups in a repeating unit. Examples of the arylalkylene-type epoxy resin include a xylylene-type epoxy resin, a biphenyldimethylene-type epoxy resin, and the like. Among them, a biphenyldimethylene-type epoxy resin is preferable from the viewpoint of further exerting the effect of the present invention.

The novolac-type epoxy resin having a condensed ring aromatic hydrocarbon structure is naphthalene, anthracene, phenanthrene, tetracene, chrysene, pyrene, triphenylene, and tetraphene, and other novolac-type epoxy resins having a condensed ring aromatic hydrocarbon structure. The novolac-type epoxy resin having a condensed ring aromatic hydrocarbon structure is excellent in low thermal expansion since a plurality of aromatic rings can be regularly arranged, and is excellent in heat resistance since a glass transition temperature is high. Since the novolac-type epoxy resin having a condensed ring aromatic hydrocarbon structure has a large molecular weight of a repeating structure, the novolac-type epoxy resin is excellent in flame retardancy as compared with the novolac-type epoxy of the related art, and the weaknesses of the cyanate resin can be improved by combining with a cyanate resin.

The novolac-type epoxy resin having a condensed ring aromatic hydrocarbon structure is obtained by epoxidizing a novolac-type phenol resin synthesized from a phenol compound, a formaldehyde compound, and a condensed ring aromatic hydrocarbon compound.

Examples of the phenol compound include cresols such as phenol, o-cresol, m-cresol, and p-cresol; xylenols such as 2,3-xylenol, 2,4-xylenol, 2,5-xylenol, 2,6-xylenol, 3,4-xylenol, and 3,5-xylenol; trimethylphenols such as 2,3,5-trimethylphenol; ethylphenols such as o-ethylphenol, m-ethylphenol, and p-ethylphenol; alkylphenols such as isopropylphenol, butylphenol, and t-butylphenol; phenylphenols such as o-phenylphenol, m-phenylphenol, and p-phenylphenol; naphthalene diols such as 1,5-dihydroxynaphthalene, 1,6-dihydroxynaphthalene, and 2,7-dihydroxynaphthalene; polyphenols such as resorcinol, catechol, hydroquinone, pyrogallol, and phloroglucinol; and alkylpolyphenols such as alkylresorcinol, alkylcatechol, and alkylhydroquinone. Among these phenol compounds, phenol is preferable from the viewpoint of cost and the effect on the decomposition reaction.

Examples of the aldehyde compound include formaldehyde, paraformaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, salicylaldehyde, dihydroxybenzaldehyde, trihydroxybenzaldehyde, and 4-hydroxy-3-methoxy aldehyde paraformaldehyde.

Examples of the condensed ring aromatic hydrocarbon compound include a naphthalene derivative such as methoxynaphthalene or butoxynaphthalene; an anthracene derivative such as methoxyanthracene; a phenanthrene derivative such as methoxyphenanthrene; other tetracene derivatives; a chrysene derivative; a pyrene derivative; a triphenylene derivative; and a tetraphene derivative.

Examples of the novolac-type epoxy resin having a condensed ring aromatic hydrocarbon structure include a methoxynaphthalene-modified ortho-cresol novolac epoxy resin, a butoxynaphthalene-modified meta(para)cresol novolac epoxy resin, and a methoxynaphthalene-modified novolac epoxy resin.

Examples of the naphthalene-type epoxy resin include a naphthalene-type epoxy resin such as a naphthol-type epoxy resin, a naphthalene diol-type epoxy resin, a bi- to tetra-functional epoxy-type naphthalene resin, a naphthylene ether-type epoxy resin, a binaphthyl-type epoxy resin, a naphthalene aralkyl-type epoxy resin, or a naphthalene-modified cresol novolac-type epoxy resin.

As a weight average molecular weight of the epoxy resin, any appropriate weight average molecular weight can be adopted within a range that does not impair the effect of the present invention. The weight average molecular weight of the epoxy resin is preferably 500 to 20,000, and more preferably 800 to 15,000, from the viewpoint of further exerting the effect of the present invention. The weight average molecular weight can be measured by, for example, gel permeation chromatography (GPC, standard substance: in terms of polystyrene).

When the resin composition (a) contains an epoxy resin, the epoxy resin is contained in the resin composition (a) in an amount of preferably 1% by weight to 55% by weight, and more preferably 2% by weight to 40% by weight, with respect to the total solid content of the resin composition (a), from the viewpoint of further exerting the effect of the present invention.

When the resin composition (a) contains at least one selected from the group consisting of a cyanate resin and an epoxy resin, the resin composition (a) may further contain a phenol resin. When these resins are used in combination, a crosslinking density can be controlled, reactivity can be easily controlled, and excellent dimensional stability can be exhibited when a circuit board is produced.

Examples of the phenol resin include a novolac-type phenol resin, a resol-type phenol resin, an arylalkylene-type phenol resin, and the like.

Among these phenol resins, an arylalkylene-type phenol resin is preferable from the viewpoint of further exerting the effect of the present invention. Examples of the arylalkylene-type phenol resin include a xylylene-type phenol resin and a biphenyldimethylene-type phenol resin.

As a weight average molecular weight of the phenol resin, any appropriate weight average molecular weight can be adopted within a range that does not impair the effect of the present invention. The weight average molecular weight of the phenol resin is preferably 400 to 18,000, and more preferably 500 to 15,000, from the viewpoint of further exerting the effect of the present invention. The weight average molecular weight can be measured by, for example, gel permeation chromatography (GPC, standard substance: in terms of polystyrene).

When the resin composition (a) contains a phenol resin, the phenol resin is contained in the resin composition (a) in an amount of preferably 1% by weight to 55% by weight, and more preferably 2% by weight to 40% by weight, with respect to the total solid content of the resin composition (a), from the viewpoint of further exerting the effect of the present invention.

<<Inorganic Filler>>

Examples of the inorganic filler include a silicate such as talc, calcined clay, uncalcined clay, mica, or glass; an oxide such as titanium oxide, alumina, boehmite, silica, or fused silica; a carbonate such as calcium carbonate, magnesium carbonate, or hydrotalcite; a hydroxide such as aluminum hydroxide, magnesium hydroxide, or calcium hydroxide; a sulfate or sulfite such as barium sulfate, calcium sulfate, or calcium sulfite; a borate such as zinc borate, barium metaborate, aluminum borate, calcium borate, or sodium borate; a nitride such as aluminum nitride, boron nitride, silicon nitride, or carbon nitride; and a titanate such as strontium titanate or barium titanate. Among these inorganic fillers, silica is preferable, and fused silica is more preferable, from the viewpoint of further exerting the effect of the present invention. Examples of the shape of the fused silica include a crushed shape and a spherical shape.

The inorganic filler is preferably spherical silica from the viewpoint of improving filling property of the inorganic filler.

The inorganic filler may be used alone or in combination of two or more thereof.

The inorganic filler may be an inorganic filler having a monodispersed average particle diameter, or may be an inorganic filler having a polydispersed average particle diameter.

The average particle diameter of the inorganic filler is preferably 0.01 μm to 5.0 μm, and more preferably 0.1 μm to 2.0 μm, from the viewpoint of further exerting the effect of the present invention. The average particle diameter of the inorganic filler can be determined, for example, by measuring a particle diameter distribution of the particles on a volume basis using a laser diffraction particle diameter distribution measuring apparatus (LA-500, manufactured by HORIBA, Ltd.) and measuring a median diameter (D50) as an average particle diameter.

The inorganic filler is contained in the resin composition (a) in an amount of preferably 20% by weight to 80% by weight, and more preferably 30% by weight to 75% by weight, with respect to the total solid content of the resin composition (a), from the viewpoint of further exerting the effect of the present invention.

<<Hollow Resin Particles>>

The resin layer (A) contains hollow resin particles. Therefore, the resin composition (a) contains hollow resin particles.

The hollow resin particles are contained in the resin layer (A) in an amount of preferably 1% by weight to 50% by weight, more preferably 3% by weight to 45% by weight, still more preferably 5% by weight to 40% by weight, and particularly preferably 10% by weight to 35% by weight, with respect to the total amount of the resin layer (A). When the content of the hollow resin particles in the resin layer (A) with respect to the total amount of the resin layer (A) is within the above range, the effect of the present invention can be further exerted.

Since the resin layer (A) is formed of the resin composition (a), the hollow resin particles are contained in the resin composition (a) in an amount of preferably 1% by weight to 50% by weight, more preferably 3% by weight to 45% by weight, still more preferably 5% by weight to 40% by weight, and particularly preferably 10% by weight to 35% by weight, with respect to the total solid content of the resin composition (a). When the content of the hollow resin particles in the resin composition (a) with respect to the total solid content of the resin composition (a) is within the above range, the effect of the present invention can be further exerted.

Observation of the presence or absence of the hollow and the shape of the hollow resin particles can be performed, for example, by the following method. First, the hollow resin particles as a dry powder are subjected to a surface treatment (10 Pa, 5 mA, 10 seconds) using, for example, a coating apparatus "Osmium Coater Neoc-Pro" manufactured by Meiwafosis Co., Ltd., the hollow resin particles are observed with a transmission electron microscope (TEM) (H-7600 manufactured by Hitachi High-Technologies Corporation), and then the presence or absence of the hollow and the shape of the hollow resins particle can be confirmed. In this case, an acceleration voltage can be set to, for example, 80 kV, and a magnification can be set to, for example, 5,000 times or 10,000 times.

Typical examples of the hollow resin particles include at least one selected from the group consisting of hollow resin particles (1) to (3) according to the following preferred embodiments.

<Hollow Resin Particles (1) According to Preferred Embodiment>

The hollow resin particles (1) are hollow resin particles having a shell portion and a hollow portion surrounded by the shell portion. The term "hollow" as used herein means a state in which the inside is filled with a substance other than a resin, for example, a gas, a liquid, or the like, and preferably means a state in which the inside is filled with a gas, from the viewpoint of further exerting the effect of the present invention.

The hollow portion may have one hollow region, or may have a plurality of hollow regions. It is preferable that the hollow portion has one hollow region from the viewpoint of relatively increasing the resin component constituting the shell portion and preventing penetration of a base material or the like into the hollow portion.

An average particle diameter of the hollow resin particles (1) is preferably 0.1 μm to 5.0 μm, more preferably 0.15 μm to 1.0 μm, still more preferably 0.2 μm to 0.8 μm, and particularly preferably 0.3 μm to 0.6 μm. When the average particle diameter of the hollow resin particles (1) is within the above range, the effect of the present invention can be further exerted. When the average particle diameter of the hollow resin particles (1) is less than 0.1 μm, a thickness of the shell portion becomes relatively thin, such that the hollow resin particles having sufficient strength may not be obtained. When the average particle diameter of the hollow resin particles (1) is more than 5.0 μm, a phase separation between a polymer produced by polymerization of a monomer component during suspension polymerization and a solvent hardly occurs, which may make it difficult to form the shell portion.

The average particle diameter of the hollow resin particles (1) can be measured, for example, by the following method. First, the average particle diameter Z of the hollow resin particles (1) is measured using a dynamic light scattering method, and the measured average particle diameter Z is taken as the average particle diameter of the obtained hollow resin particles (1). That is, first, the obtained slurry-like hollow resin particles (1) are diluted with ion-exchanged water, an aqueous dispersion adjusted to 0.1% by weight is irradiated with laser light, and an intensity of scattered light scattered from the hollow resin particles (1) is measured with a time change in units of microseconds. Then, the average particle diameter Z of the hollow resin particles (1) is determined by a cumulant analysis method for calculating the average particle diameter by applying the scattering intensity distribution caused by the detected hollow resin particles (1) to a normal distribution. The average particle diameter Z can be easily measured with a commercially available particle diameter measuring apparatus. For example, the average particle diameter Z can be measured using a particle diameter measuring apparatus (Zetasizer Nano ZS manufactured by Malvern Panalytical Ltd.). Usually, a commercially available particle diameter measuring apparatus is equipped with data analysis software, and the data analysis software can automatically analyze measurement data to calculate the average particle diameter Z.

In the hollow resin particles (1), the total concentration of a lithium element, a sodium element, a potassium element, a magnesium element, and a potassium element contained in the hollow resin particles (1) is preferably 200 mg/kg or less, more preferably 150 mg/kg or less, still more preferably 100 mg/kg or less, and particularly preferably 50 mg/kg or less. When the total concentration of the lithium element, the sodium element, the potassium element, the magnesium element, and the potassium element contained in the hollow resin particles (1) is within the above range, the effect of the present invention can be further exerted. When the total concentration of the lithium element, the sodium element, the potassium element, the magnesium element, and the potassium element contained in the hollow resin particles (1) is too large out of the above range, a semiconductor member containing the hollow resin particles (1) may not exhibit excellent low dielectric property.

The amount of the metal elements contained in the hollow resin particles (1) can be measured, for example, as follows.
(Measurement Sample)

About 0.5 g of the hollow resin particles is precisely weighed in a washed 50 mL container. 1 mL of ethanol for washing is added and then mixed and dispersed well. Further, 50 mL of ion-exchanged water is added, and the mixture is well mixed. Ultrasonic washing and extraction are performed for about 10 minutes, and then the mixture is allowed to stand in a thermostatic chamber at 60° C. for 60 minutes. The slurry after standing is filtered through a 0.20 μm aqueous chromatography disc to obtain a measurement sample.
(Measurement Method)

The metal element concentration in the measurement sample is measured under the following conditions. The metal element concentration is determined using a calibration curve created in advance. The metal element amount is calculated by the following formula.

Metal element amount (mg/kg)=Measured metal element concentration (μg/mL)×51 (mL)/Sample amount (g)

In addition, when the metal element amount is equal to or less than a lower limit of quantity, the amount is set to 1 mg/kg.
(ICP Measurement Conditions)

The conditions are as follows.
Measuring apparatus: Multitype ICP emission spectrometer "ICPE-9000" manufactured by Shimadzu Corporation
Measured elements: Zn, Ca, Si, Fe, Cr, Na, Mg, Cu, P, K, S, Al, Mn, Ba, Sr
Observation direction: axial direction
High-frequency output: 1.20 kw
Carrier flow rate: 0.7 L/min
Plasma flow rate: 10.0 L/min
Auxiliary flow rate: 0.6 L/min
Exposure time: 30 seconds
Standard solution for calibration curve: "XSTC-13" general-purpose mixture standard solution, mixture of 31 elements (base: 5% $HNO_3$) (about 10 mg/L each), "XSTC-8" general-purpose mixture standard solution, mixture of 13 elements (base: $H_2O$/trace: HF) (about 10 mg/L each), SPEX CertiPrep Inc., U.S.A.

In the hollow resin particles (1), the total concentration of fluoride ions, chloride ions, nitrite ions, nitrate ions, phosphate ions, and sulfate ions contained in the hollow resin particles (1) is preferably 200 mg/kg or less, more preferably 150 mg/kg or less, still more preferably 100 mg/kg or less, and particularly preferably 50 mg/kg or less. When the total concentration of the fluoride ions, the chloride ions, the nitrite ions, the nitrate ions, the phosphate ions, and the sulfate ions contained in the hollow resin particles (1) is within the above range, the effect of the present invention can be further exerted. When the total concentration of the fluoride ions, the chloride ions, the nitrite ions, the nitrate ions, the phosphate ions, and the sulfate ions contained in the hollow resin particles (1) is too large out of the above range, a semiconductor member containing the hollow resin particles (1) may not exhibit excellent low dielectric property.

The amount of the ions contained in the hollow resin particles (1) can be measured, for example, as follows.
(Measurement Sample)

About 0.5 g of the hollow resin particles is precisely weighed in a washed 50 mL container. 1 mL of ethanol for washing is added and then mixed and dispersed well. Further, 50 mL of ion-exchanged water is added, and the mixture is well mixed. Ultrasonic washing and extraction are performed for about 10 minutes, and then the mixture is allowed to stand in a thermostatic chamber at 60° C. for 60 minutes. The slurry after standing is filtered through a 0.20 μm aqueous chromatography disc to obtain a measurement sample.
(Measurement Method)

A standard solution is measured under the following measurement conditions to create a calibration curve. Next, the sample solution is measured under the same conditions. Based on the obtained results, an ion elution concentration is determined using the calibration curve. The ion amount of the sample is calculated by the following formula.

Ion amount (mg/kg)=Measured ion elution concentration (μg/mL)×51 (mL)/Sample amount (g)

In addition, when the ion amount is equal to or less than a lower limit of quantity, the amount is set to 1 mg/kg.
(Ion Chromatograph Measurement Conditions)

The conditions are as follows.
Measuring apparatus: Ion chromatograph "IC-2001" manufactured by Tosoh Corporation
Measured ions: $F^-$, $Cl^-$, $NO_2^-$, $Br^-$, $NO_3^-$, $PO_4^{3-}$, $SO_4^{2-}$
Column: "TSKGEK superIC-AZ" manufactured by Tosoh Corporation
Mobile phase: 3.2 mM $Na_2CO_3$+1.9 mM $NaHCO_3$
Flow rate: 0.8 mL/min
Column temperature: 40° C.
Injection amount: 30 μL
[Shell Portion]

The shell portion contains an aromatic polymer (P1) obtained by polymerizing a monomer composition containing an aromatic crosslinking monomer (a), an aromatic monofunctional monomer (b), and a (meth)acrylic acid ester-based monomer (c) represented by formula (1). The shell portion contains such an aromatic polymer (P1) obtained by polymerizing a monomer composition containing an aromatic crosslinking monomer (a), an aromatic monofunctional monomer (b), and a (meth)acrylic acid ester-based monomer (c) represented by formula (1), such that the effect of the present invention can be further exerted. In particular, the (meth)acrylic acid ester-based monomer (c) having a specific structure is adopted as a monomer constituting the aromatic polymer (Pt), such that the effect of the present invention can be further exerted. In addition, the (meth)acrylic acid ester-based monomer (c) having a specific structure is adopted as a monomer constituting the aromatic polymer (P1), such that polar groups contained in the aromatic polymer (P1) can enhance adhesion between the hollow resin particles (1) and the insulating resin.

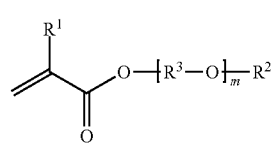

(1)

($R^1$ represents H or $CH_3$, $R^2$ represents H, an alkyl group, or a phenyl group, $R^3$-O represents an oxyalkylene group having 2 to 18 carbon atoms, and m is an average addition molar number of the oxyalkylene group and represents an integer of 1 to 100.)

A content ratio of the aromatic polymer (P1) in the shell portion is preferably 60% by weight to 100% by weight, more preferably 70% by weight to 100% by weight, still more preferably 80% by weight to 100% by weight, and particularly preferably 90% by weight to 100% by weight, from the viewpoint of further exerting the effect of the present invention.

(Aromatic Polymer (P1))

The aromatic polymer (P1) is obtained by polymerizing a monomer composition containing an aromatic crosslinking monomer (a), an aromatic monofunctional monomer (b), and a (meth)acrylic acid ester-based monomer (c) represented by formula (1). That is, the aromatic polymer (P1) contains a structural unit derived from the aromatic crosslinking monomer (a), a structural unit derived from the aromatic monofunctional monomer (b), and a structural unit derived from the (meth)acrylic acid ester-based monomer (c) represented by formula (1).

From the viewpoint of further exerting the effect of the present invention, the monomer composition contains preferably 10% by weight to 70% by weight of the aromatic crosslinking monomer (a), 10% by weight to 70% by weight of the aromatic monofunctional monomer (b), and 1.0% by weight to 20% by weight of the (meth)acrylic acid ester-based monomer (c) represented by formula (1), more preferably 20% by weight to 65% by weight of the aromatic crosslinking monomer (a), 20% by weight to 65% by weight of the aromatic monofunctional monomer (b), and 2.0% by weight to 18% by weight of the (meth)acrylic acid ester-based monomer (c) represented by formula (1), still more preferably 30% by weight to 60% by weight of the aromatic crosslinking monomer (a), 30% by weight to 60% by weight of the aromatic monofunctional monomer (b), and 4.0% by weight to 16% by weight of the (meth)acrylic acid ester-based monomer (c) represented by formula (1), and particularly preferably 40% by weight to 50% by weight of the aromatic crosslinking monomer (a), 40% by weight to 50% by weight of the aromatic monofunctional monomer (b), and 6.0% by weight to 14% by weight of the (meth)acrylic acid ester-based monomer (c) represented by formula (1).

The monomer composition contains the aromatic crosslinking monomer (a), the aromatic monofunctional monomer (b), and the (meth)acrylic acid ester-based monomer (c) represented by formula (1). The total content ratio of the aromatic crosslinking monomer (a), the aromatic monofunctional monomer (b), and the (meth)acrylic acid ester-based monomer (c) represented by formula (1) in the monomer composition is preferably 80% by weight to 100% by weight, more preferably 85% by weight to 100% by weight, still more preferably 90% by weight to 100% by weight, and particularly preferably 95% by weight to 100% by weight, from the viewpoint of further exerting the effect of the present invention.

The monomer composition may further contain any appropriate other monomers in addition to the aromatic crosslinking monomer (a), the aromatic monofunctional monomer (b), and the (meth)acrylic acid ester-based monomer (c) represented by formula (1) within a range that does not impair the effect of the present invention. The other monomers may be used alone or in combination of two or more thereof.

Any appropriate aromatic crosslinking monomer can be employed as long as the aromatic crosslinking monomer (a) is an aromatic monomer having crosslinking property within a range that does not impair the effect of the present invention. From the viewpoint of further exerting the effect of the present invention, examples of the aromatic crosslinking monomer (a) include divinylbenzene, divinylnaphthalene, diallyl phthalate, and the like. From the viewpoint of further exerting the effect of the present invention and from the viewpoint of reactivity, divinylbenzene is preferable as the aromatic crosslinking monomer (a).

The aromatic crosslinking monomer (a) may be used alone or in combination of two or more thereof.

Any appropriate aromatic monofunctional monomer can be employed as long as the aromatic monofunctional monomer (b) is a monofunctional aromatic monomer within a range that does not impair the effect of the present invention. From the viewpoint of further exerting the effect of the present invention, examples of the aromatic monofunctional monomer (b) include styrene, ethylvinylbenzene, α-methylstyrene, vinyltoluene, o-chlorostyrene, m-chlorostyrene, p-chlorostyrene, vinylbiphenyl, vinylnaphthalene, and the like. From the viewpoint of further exerting the effect of the present invention and from the viewpoint of reactivity, as the aromatic monofunctional monomer (b), at least one selected from the group consisting of styrene and ethylvinylbenzene is preferable.

The aromatic monofunctional monomer (b) may be used alone or in combination of two or more thereof.

The (meth)acrylic acid ester-based monomer (c) is represented by formula (1).

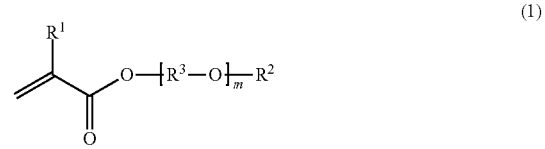

(1)

In formula (1), $R^1$ represents H or $CH_3$.

In formula (1), $R^2$ represents H, an alkyl group, or a phenyl group.

In formula (1), $R^3$—O represents an oxyalkylene group having 2 to 18 carbon atoms. That is, in formula (1), $R^3$ represents an alkylene group having 2 to 18 carbon atoms.

In formula (1), $R^3$—O is an oxyalkylene group having 2 to 18 carbon atoms, preferably an oxyalkylene group having 2 to 8 carbon atoms, and more preferably an oxyalkylene group having 2 to 4 carbon atoms. In addition, when $R^3$—O is at least two or more selected from an oxyethylene group, an oxypropylene group, and an oxybutylene group, the addition form of $R^3$—O may be any form of random addition, block addition, alternate addition, and the like. Note that the addition form described herein means the form itself, and does not mean that $R^3$—O is to be obtained by an addition reaction.

In formula (1), $R^3$—O is at least one selected from the group consisting of an oxyethylene group, an oxypropylene group, and an oxybutylene group (typically, an oxytetramethylene group) from the viewpoint of further exerting the effect of the present invention.

In formula (1), m represents an average addition molar number (may be referred to as a "chain length") of the oxyalkylene group. m is a number of 1 to 100, preferably a number of 1 to 40, more preferably a number of 2 to 30, still more preferably a number of 3 to 20, particularly preferably a number of 4 to 18, and most preferably a number of 5 to 15. When m is within the above range, the effect of the present invention can be further exerted.

In formula (1), when $R^3$—O is two or more kinds, for example, when $R^3$—O contains an oxyethylene group ($C_2H_4O$) and an oxypropylene group ($C_3H_6O$), m is the total average addition molar number of each oxyalkylene group. Specifically, for example, when —(R—O)$_m$— is —[($C_2H_4O)_p(C_3H_6O)_q$]— (as described above, the addition form may be any form of random addition, block addition, alternate addition, and the like), m=p+q.

From the viewpoint of further exerting the effect of the present invention, examples of the (meth)acrylic acid ester-based monomer (c) include methoxy polyethylene glycol methacrylate, ethoxy polyethylene glycol methacrylate, propoxy polyethylene glycol methacrylate, butoxy polyethylene glycol methacrylate, hexaoxy polyethylene glycol methacrylate, octoxy polyethylene glycol polypropylene glycol methacrylate, lauroxy polyethylene glycol methacrylate, stearoxy polyethylene glycol methacrylate, phenoxy polyethylene glycol polypropylene glycol methacrylate, methoxy polyethylene glycol acrylate, polyethylene glycol monomethacrylate, polypropylene glycol monomethacrylate, polyethylene glycol propylene glycol monomethacrylate, polyethylene glycol tetramethylene glycol monomethacrylate, propylene glycol polybutylene glycol monomethacrylate, monoethylene glycol monoacrylate, polypropylene glycol monoacrylate, and the like.

As the (meth)acrylic acid ester-based monomer (c), a commercially available product can also be employed, and for example, trade name "Blemmer" series manufactured by NOF Corporation can be employed.

The (meth)acrylic acid ester-based monomer (c) may be used alone or in combination of two or more thereof.

(Non-Crosslinking Polymer (P2))

In addition to the aromatic polymer (P1), the shell portion may further contain at least one selected from the group consisting of a polyolefin, a styrene-based polymer, a (meth)acrylic acid-based polymer, and a styrene-(meth)acrylic acid-based polymer as a non-crosslinking polymer (P2).

A content ratio of the non-crosslinking polymer (P2) in the shell portion is preferably 0% by weight to 40% by weight, more preferably 0% by weight to 30% by weight, still more preferably 0% by weight to 20% by weight, and particularly preferably 0% by weight to 10% by weight, from the viewpoint of further exerting the effect of the present invention.

Examples of the polyolefin include polyethylene, polypropylene, poly-α-olefin, and the like. From the viewpoint of solubility in the monomer composition, it is preferable to use a side-chain crystalline polyolefin using a long-chain α-olefin as a raw material, or a low molecular weight polyolefin or olefin oligomer produced by a metallocene catalyst.

Examples of the styrene-based polymer include polystyrene, a styrene-acrylonitrile copolymer, an acrylonitrile-butadiene-styrene copolymer, and the like.

Examples of the (meth)acrylic acid-based polymer include polymethyl (meth)acrylate, polyethyl (meth)acrylate, polybutyl (meth)acrylate, polypropyl (meth)acrylate, and the like.

Examples of the styrene-(meth)acrylic acid-based polymer include a styrene-methyl (meth)acrylate copolymer, a styrene-ethyl (meth)acrylate copolymer, a styrene-butyl (meth)acrylate copolymer, a styrene-propyl (meth)acrylate copolymer, and the like.

[Relative Dielectric Constant of Hollow Resin Particles (1)]

A relative dielectric constant of the hollow resin particles (1) is preferably 1.0 to 2.5, more preferably 1.0 to 2.4, and still more preferably 1.0 to 2.3. When the relative dielectric constant of the hollow resin particles (1) is within the above range, the effect of the present invention can be further exerted. When the relative dielectric constant of the hollow resin particles (1) exceeds 2.5, a semiconductor member containing the hollow resin particles (1) cannot exhibit excellent low dielectric property.

The relative dielectric constant of the hollow resin particles (1) can be calculated with reference to, for example, "Dielectric constant of mixed system" (Applied Physics, Vol. 27, No. 8 (1958)). When a relative dielectric constant of a mixed system of a dispersion medium and the hollow resin particles is ε, a relative dielectric constant of a base material (for example, a resin composition of polyimide, epoxy, or the like) as the dispersion medium is $\varepsilon_1$, a relative dielectric constant of the hollow resin particles is $\varepsilon_2$, and a volume ratio of the hollow resin particles in the mixed system is p, the following formula is established. That is, the relative dielectric constant $\varepsilon_2$ of the hollow resin particles can be calculated by experimentally obtaining ε, $\varepsilon_1$, and φ.

$$\frac{\varepsilon - \varepsilon_1}{\varepsilon + 2\varepsilon_1} = \frac{\varepsilon_2 - \varepsilon_1}{\varepsilon_2 + 2\varepsilon_1} \varphi$$

Note that the volume ratio φ of the hollow resin particles in the mixed system of the dispersion medium and the hollow resin particles can be determined as follows.

$$\varphi = \frac{\dfrac{\text{Weight of hollow resin particles in mixed system (g)}}{\text{Density of hollow resin particles (g/cm}^3\text{)}}}{\dfrac{\text{Weight of hollow resin particles in mixed system (g)}}{\text{Density of hollow resin particles (g/cm}^3\text{)}} + \dfrac{\text{Weight of base material in mixed system (g)}}{\text{Density of base material particles (g/cm}^3\text{)}}}$$

A density of the hollow resin particles can be experimentally determined using a pycnometer (COTEC Corporation, TQC 50 mL pycnometer) and a liquid polymer ARUFON UP-1080 (Toagosei Co., Ltd., density 1.05 g/cm). Specifically, the hollow resin particles and ARUFON UP-1080 are defoamed and stirred using a planetary stirring defoamer (Mazerustar KK-250, manufactured by KURABO Industries Ltd.) so that the ratio of the hollow resin particles is 10% by weight, thereby preparing a mixture for evaluation. The pycnometer having a capacity of 50 mL is filled with the mixture for evaluation, and a weight of the filled mixture for evaluation is calculated by subtracting the weight of the pycnometer in an empty state from the weight of the pycnometer filled with the mixture. From this $$\text{Density of hollow resin particles (g/cm}^3) = \frac{\text{Weight of mixture for evaluation (g)} \times 0.1}{50 \text{ (cm}^3) = \dfrac{\text{Weight of mixture for evaluation (g)} \times 0.1}{\text{Density of UP-1080 (g/cm}^3)}}$$

value, the density of the hollow resin particles can be calculated using the following formula.

<Production Method of Hollow Resin Particles (1) According to Preferred Embodiment>

The hollow resin particles (1) can be produced by any appropriate method within a range that does not impair the effect of the present invention.

Such a production method includes, for example, a dispersion step (Step 1), a polymerization step (Step 2), a washing step (Step 3), and a drying step (Step 4).

[Step 1: Dispersion Step]

Step 1 is a step of dispersing, in an aqueous solution containing a dispersing agent, an organic mixed solution containing a monomer composition containing an aromatic crosslinking monomer (a), an aromatic monofunctional monomer (b), and a (meth)acrylic acid ester-based monomer (c) represented by formula (1), a polymerization initiator, and an organic solvent having a boiling point of lower than 100° C.

The dispersion of the organic mixed solution in the aqueous solution may employ any appropriate dispersion method as long as the organic mixed solution can be present in the form of droplets in the aqueous solution within a range that does not impair the effect of the present invention. Such a dispersion method is typically a dispersion method using a homogenizer, and examples thereof include an ultrasonic homogenizer, a high-pressure homogenizer, and the like.

The aqueous solution contains an aqueous medium and a dispersing agent.

Examples of the aqueous medium include water, a mixed medium of water and a lower alcohol (methanol, ethanol, or the like), and the like. The water is preferably at least one selected from ion-exchanged water and distilled water.

As the dispersing agent, any appropriate dispersing agent can be adopted within a range that does not impair the effect of the present invention. From the viewpoint of further exerting the effect of the present invention, a surfactant is preferably employed as the dispersing agent. Examples of the surfactant include an anionic surfactant, a cationic surfactant, an amphoteric surfactant, a nonionic surfactant, and the like.

Examples of the anionic surfactant include a non-reactive anionic surfactant such as alkyl sulfate ester fatty acid salt, alkylbenzenesulfonic acid salt, alkylnaphthalenesulfonic acid salt, alkanesulfonic acid salt, alkyl diphenyl ether sulfonic acid salt, dialkylsulfosuccinic acid salt, monoalkylsulfosuccinic acid salt, and polyoxyethylene alkyl phenyl ether phosphoric acid salt; a reactive anionic surfactant such as polyoxyethylene-1-(allyloxymethyl)alkyl ether sulfate ester ammonium salt, polyoxyethylene alkyl propenyl phenyl ether sulfate ester ammonium salt, and ammonium polyoxyalkylene alkenyl ether sulfate; and the like.

Examples of the cationic surfactant include a cationic surfactant such as alkyltrimethylammonium salt, alkyltriethylammonium salt, dialkyldimethylammonium salt, dialkyldiethylammonium salt, N-polyoxyalkylene-N,N,N-trialkylammonium salt, and the like.

Examples of the amphoteric surfactant include lauryldimethylamine oxide, a phosphoric acid ester salt, a phosphorus acid ester-based surfactant, and the like.

Examples of the nonionic surfactant include polyoxyethylene alkyl ether, polyoxyethylene alkyl phenyl ether, polyoxyethylene fatty acid ester, sorbitan fatty acid ester, polysorbitan fatty acid ester, polyoxyethylene alkylamine, glycerin fatty acid ester, an oxyethylene-oxypropylene block polymer, and the like.

The amount of the surfactant added is preferably 0.01 parts by weight to 1 part by weight with respect to 100 parts by weight of the organic mixed solution. The surfactant may be used alone or in combination of two or more thereof.

The aqueous solution may contain any appropriate additional components within a range that does not impair the effect of the present invention.

The organic mixed solution contains a monomer composition containing an aromatic crosslinking monomer (a), an aromatic monofunctional monomer (b), and a (meth)acrylic acid ester-based monomer (c) represented by formula (1), a polymerization initiator, and an organic solvent having a boiling point of lower than 100° C.

As the monomer composition contained in the organic mixed solution, the description in the section of <Hollow resin particles (1) according to preferred embodiment> can be incorporated as it is.

As the polymerization initiator, any appropriate polymerization initiator can be adopted within a range that does not impair the effect of the present invention.

The polymerization initiator preferably has a 10-hour half-life temperature of 90° C. or lower. When such a polymerization initiator is used, the polymerization initiator remaining in the hollow resin particles can be completely decomposed, and for example, when a semiconductor member containing the hollow resin particles (1) is heated by solder reflow or the like, oxidation degradation of the resin and gas generation due to the remaining polymerization initiator can be suppressed.

The polymerization initiator is preferably polymerized with a combination of a reaction temperature and a reaction time at which a decomposition rate of the polymerization initiator calculated by the following formula is 98% or more. Under such polymerization conditions, the polymerization initiator remaining in the hollow resin particles (1) can be completely decomposed, and for example, when a semiconductor member containing the hollow resin particles (1) is heated by solder reflow or the like, oxidation degradation of the resin and gas generation due to the remaining polymerization initiator can be suppressed.

Decomposition rate $(\%) = (1-\exp(-k_d t)) \times 100$ $k_d = A \exp(-\Delta E/RT)$ In the formula, $k_d$ represents the pyrolysis rate constant, t represents a reaction time (hr), A represents a frequency factor ($hr^{-1}$), $\Delta E$ represents an activation energy (J/mol), R represents a gas constant (8.314 J/mol·K), and T represents a reaction temperature (K).

Examples of the polymerization initiator include an organic peroxide such as lauroyl peroxide, benzoyl peroxide, ortho-chlorobenzoyl peroxide, ortho-methoxy benzoyl peroxide, 3,5,5-trimethylhexanoyl peroxide, t-butylperoxy-2-ethylhexanoate, or di-t-butyl peroxide; an azo-based compound such as 2,2'-azobisisobutyronitrile, 1,1'-azobiscyclohexanecarbonitrile, 2,2'-azobis(2,4-dimethylvaleronitrile); and the like.

The amount of the polymerization initiator added is preferably 0.1 parts by weight to 5 parts by weight with respect to 100 parts by weight of the monomer composition. The polymerization initiator may be used alone or in combination of two or more thereof.

Examples of the organic solvent having a boiling point of lower than 100° C. include heptane, hexane, cyclohexane, methyl acetate, ethyl acetate, methyl ethyl ketone, chloroform, carbon tetrachloride, and the like.

The organic solvent having a boiling point of lower than 100° C. may be a mixed solvent.

By using the organic solvent having a boiling point of lower than 100° C. as the organic solvent, the solvent can be easily removed from the hollow portions of the obtained hollow resin particles (1), and the production cost can be reduced.

The amount of the organic solvent having a boiling point of lower than 100° C. added is preferably 20 parts by weight to 250 parts by weight with respect to 100 parts by weight of the monomer composition.

The organic mixed solution may contain any appropriate additional components within a range that does not impair the effect of the present invention. Examples of the additional components include the non-crosslinking polymer (P2) described above.

The amount of the non-crosslinking polymer (P2) added is preferably 0 parts by weight to 67 parts by weight with respect to 100 parts by weight of the monomer composition. The non-crosslinking polymer (P2) may be used alone or in combination of two or more thereof.

[Step 2: Polymerization Step]

Step 2 is a step of performing suspension polymerization by heating a dispersion liquid obtained in Step 1.

As a polymerization temperature, any appropriate polymerization temperature can be adopted as long as the polymerization temperature is a temperature suitable for suspension polymerization within a range that does not impair the effect of the present invention. The polymerization temperature is preferably 30° C. to 80° C.

As a polymerization time, any appropriate polymerization time can be adopted as long as the polymerization time is a time suitable for suspension polymerization within a range that does not impair the effect of the present invention. The polymerization time is preferably 1 hour to 20 hours.

Post-heating preferably performed after polymerization is a preferred treatment for obtaining highly completed hollow resin particles (1).

As a temperature of the post-heating that is preferably performed after polymerization, any appropriate temperature can be adopted within a range that does not impair the effect of the present invention. The temperature of the post-heating is preferably 50° C. to 120° C.

As a time of the post-heating that is preferably performed after polymerization, any appropriate time can be adopted within a range that does not impair the effect of the present invention. The time of the post-heating is preferably 1 hour to 10 hours.

[Step 3: Washing Step]

Step 3 is a step of washing the slurry obtained in Step 2.

As a washing method, any appropriate washing method can be adopted within a range that does not impair the effect of the present invention. Examples of the washing method include (1) a method of removing impurities after forming hollow resin particles (1) by repeating multiple times an operation of depositing the hollow resin particles (1) using a high-speed centrifuge or the like with extraordinarily high centrifugal acceleration, removing the supernatant, and newly adding ion-exchanged water or distilled water to disperse the deposited hollow resin particles (1) in the ion-exchanged water; (2) a method of removing impurities by performing washing by a cross-flow filtration method using a ceramic filter or the like; (3) a method of adding, to hollow resin particles (1), a solvent to serve as an aggregating agent of particles thereby to cause particles to aggregate and settle in the solvent, separating the hollow resin particles (1) using a filter or the like, and washing the particles with a washing solvent; and the like.

In the washing method of (1) above, it is preferable to perform washing using ion-exchanged water or distilled water in an amount of 5 times or more the amount of the slurry.

The hollow resin particles (1) having a small specific gravity are preferably washed by a cross-flow filtration method using the ceramic filter of (2) or the like.

[Step 4: Drying Step]

Step 4 is a step of drying the slurry after washing obtained in Step 3.

As a drying method, any appropriate drying method can be adopted within a range that does not impair the effect of the present invention. Examples of the drying method include drying by heating.

As a temperature of the heating, any appropriate temperature can be adopted within a range that does not impair the effect of the present invention. The temperature of the heating is preferably 50° C. to 120° C.

As a time of the heating, any appropriate time can be adopted within a range that does not impair the effect of the present invention. The time of the heating is preferably 1 hour to 10 hours.

<Hollow Resin Particles (2) According to Preferred Embodiment>

The hollow resin particles (2) are hollow resin particles having a hole portion inside the particle. As a structure of the hole portion inside the particle, any appropriate structure can be adopted within a range that does not impair the effect of the present invention. From the viewpoint of further exerting the effect of the present invention, examples of the structure include a porous structure and a single hollow structure. The term "hole portion" as used herein means a state in which the inside is filled with a substance other than a resin, for example, a gas, a liquid, or the like, and preferably means a state in which the inside is filled with a gas, from the viewpoint of further exerting the effect of the present invention.

A volume average particle diameter of the hollow resin particles (2) is preferably 0.5 μm to 100 μm, more preferably 1.0 μm to 80 μm, still more preferably 1.5 μm to 60 μm, and particularly preferably 2.0 μm to 40 μm. When the volume average particle diameter of the hollow resin particles (2) is within the above range, the effect of the present invention can be further exerted. When the volume average particle diameter of the hollow resin particles (2) is too small out of the above range, a thickness of a surface layer of the particle is relatively thin, and thus the hollow resin particles may not have sufficient mechanical strength. When the volume average particle diameter of the hollow resin particles (2) is too large out of the above range, a phase separation between a polymer produced by polymerization of a monomer component during suspension polymerization and a solvent hardly occurs, which may make it difficult to form the surface layer. Note that the volume average particle diameter of the hollow resin particles (2) can be obtained by a Coulter method as described below.

The volume average particle diameter of the hollow resin particles (2) can be obtained by a Coulter method as described below. That is, the volume average particle diameter of the hollow resin particles (2) is measured by a Coulter Multisizer (registered trademark) 3 (measuring apparatus manufactured by Beckman Coulter, Inc.). The measurement is performed using an aperture calibrated according to Multisizer (registered trademark) 3 User's Manual published by Beckman Coulter, Inc. Note that the aperture used for the measurement is appropriately selected according to the size of the particle to be measured. Current (aperture current) and Gain are appropriately set according to the size of the selected aperture. For example, when an aperture having a size of 50 μm is selected, Current (aperture current) is set to −800, and Gain is set to 4.

As a measurement sample, a dispersion obtained by dispersing 0.1 g of the particles in 0.1% by weight of a 10 ml nonionic surfactant aqueous solution using a touch mixer ("TOUCHMIXER MT-31", manufactured by Yamato Scientific Co., Ltd.) and an ultrasonic cleaner ("ULTRASONIC CLEANER VS-150", manufactured by Velvo-Clear Co., Ltd.) is used. During the measurement, the inside content of the beaker is gently stirred to such an extent that air bubbles do not enter, and the measurement is terminated when 100,000 particles are measured. Note that the volume average particle diameter of the particles is an arithmetic average in a particle diameter distribution of 100,000 particles on a volume basis.

In the hollow resin particles (2), a reduction rate of a relative dielectric constant Dk1 of a film (F1) in which 80 parts by weight of polyimide and 20 parts by weight of the hollow resin particles (2) are blended to a relative dielectric constant Dk0 of a film (F0) formed only of the polyimide is preferably 3% or more, more preferably 5% or more, still more preferably 10% or more, and particularly preferably 15% or more. The reduction rate of the relative dielectric constant Dk1 of the film (F1) to the relative dielectric constant Dk0 of the film (F0) is preferably as large as possible, but is practically 35% or less. When the reduction rate of the relative dielectric constant Dk1 of the film (F1) to the relative dielectric constant Dk0 of the film (F0) is within the above range, the effect of the present invention can be further exerted. When the reduction rate of the relative dielectric constant Dk1 of the film (F1) to the relative dielectric constant Dk0 of the film (F0) is too small out of the above range, a semiconductor member containing the hollow resin particles (2) cannot exhibit excellent low dielectric property.

Note that the reduction rate of the relative dielectric constant Dk1 of the film (F1) to the relative dielectric constant Dk0 of the film (F0) is calculated by the following formula.

Reduction rate (%) of relative dielectric constant $Dk1$ of film ($F1$) to relative dielectric constant $Dk0$ of film ($F0$)=[($Dk0-Dk1$)/$Dk0$]×100

The relative dielectric constant Dk and the dielectric loss tangent Df can be measured, for example, as follows. Using any appropriate polyimide resin, the hollow resin particles (2) to be measured are dispersed in ethyl acetate so that the concentration of the hollow resin particles (2) is 20% by weight with respect to the total solid content (polyimide resin+hollow resin particles (2)), and defoaming and stirring are performed using a planetary stirring defoamer (Mazerustar KK-250, manufactured by KURABO Industries Ltd.), thereby preparing a mixture for evaluation. The mixture for evaluation is applied to a glass plate having a thickness of 5 mm using an applicator set to a wet thickness of 250 μm, heated at 60° C. for 30 minutes, 90° C. for 10 minutes, 150° C. for 30 minutes, and 200° C. for 30 minutes to remove ethyl acetate, and then cooled to room temperature to obtain a film sample containing the hollow resin particles (2), and a relative dielectric constant and a dielectric loss tangent of the obtained film are evaluated by a cavity resonance method (measurement frequency: 5.8 GHz).

In the hollow resin particles (2), a reduction rate of a dielectric loss tangent Df1 of the film (F1) to a dielectric loss tangent Df0 of the film (F0) is preferably 3% or more, more preferably 5% or more, still more preferably 10% or more, and particularly preferably 15% or more. The reduction rate of the dielectric loss tangent Df1 of the film (F1) to the dielectric loss tangent Df0 of the film (F0) is preferably as large as possible, but is practically 35% or less. When the reduction rate of the dielectric loss tangent Df1 of the film (F1) to the dielectric loss tangent Df0 of the film (F0) is within the above range, the effect of the present invention can be further exerted. When the reduction rate of the dielectric loss tangent Df1 of the film (F1) to the dielectric loss tangent Df0 of the film (F0) is too small out of the above range, a semiconductor member containing the hollow resin particles (2) cannot exhibit excellent low dielectric property.

Note that the reduction rate of the dielectric loss tangent Df1 of the film (F1) to the dielectric loss tangent Df0 of the film (F0) is calculated by the following formula.

Reduction rate (%) of dielectric loss tangent $Df1$ of film ($F1$) to dielectric loss tangent $Df0$ of film ($F0$)=[($Df0-Df1$)/$Df0$]×100

A specific surface area of the hollow resin particles (2) is preferably 1 m$^2$/g to 30 m$^2$/g, more preferably 1 m$^2$/g to 25 m$^2$/g, still more preferably 1 m$^2$/g to 20 m$^2$/g, and particularly preferably 1 m$^2$/g to 15 m$^2$/g. When the specific surface area is too small out of the above range, pores are likely to be formed at an interface between the particles and the insulating resin, and the strength of the insulating resin material may be reduced or low hygroscopicity may be deteriorated. When the specific surface area is too large out of the above range, the strength of the hollow resin particles is reduced, the particles are broken in the production process, and the hollow portion may not be maintained.

The specific surface area of the hollow resin particles (2) is measured by the BET method (nitrogen adsorption method) described in JIS Z 8830:2001 of ISO 9277, the first edition. A BET nitrogen adsorption isotherm of target particles is measured using an automatic specific surface area/pore distribution measuring apparatus "Tristar II" manufactured by Shimadzu Corporation, and the specific surface area is calculated from the nitrogen adsorption amount using a BET multipoint method. After a pre-treatment by heating gas purge is performed, measurement is performed using nitrogen as an adsorbent under a condition of an adsorbent cross-sectional area of 0.162 nm$^2$ by a constant volume method. Note that the pre-treatment is specifically performed by performing nitrogen purge for 20 minutes while heating a container containing the particles at 65° C., allowing the container to cool to room temperature, and then performing vacuum degassing until the pressure in the container becomes 0.05 mmHg or less while heating the container at 65° C.

A bulk specific gravity of the hollow resin particles (2) is preferably 0.01 g/cm$^3$ to 0.6 g/cm$^3$, more preferably 0.02 g/cm$^3$ to 0.55 g/cm$^3$, still more preferably 0.03 g/cm$^3$ to 0.5 g/cm$^3$, and particularly preferably 0.05 g/cm$^3$ to 0.45 g/cm$^3$. When the bulk specific gravity is too small out of the above range, the strength of the hollow resin particles is reduced, the particles are broken in the production process, and the hollow portion may not be maintained. When the bulk specific gravity is too large out of the above range, the hollow portion may be reduced, such that sufficient low dielectric property cannot be exhibited.

The bulk specific gravity of the hollow resin particles (2) can be measured in accordance with JIS K5101-12-1 (Pigment test method-Part 12: Apparent density or apparent specific volume-Section 1: Static setting method).

The hollow resin particles (2) preferably contain a polymer (P) containing at least one selected from the group consisting of a structural unit (I) derived from a vinyl-based monomer and a structural unit (II) derived from a phosphoric acid ester-based monomer.

Typically, the main component of the hollow resin particles (2) is a polymer (P) containing at least one selected from the group consisting of a structural unit (I) derived from a vinyl-based monomer and a structural unit (II) derived from a phosphoric acid ester-based monomer. Here, the "main component" means that a content ratio in the entirety is preferably 50% by weight or more, more preferably 70% by weight or more, still more preferably 90% by weight or more, particularly preferably 95% by weight or more, and most preferably 98% by weight or more.

A content ratio of the polymer (P) in the hollow resin particles (2) is preferably 50% by weight to 100% by weight, more preferably 70% by weight to 100% by weight, still more preferably 90% by weight to 100% by weight, particularly preferably 95% by weight to 100% by weight, and most preferably 98% by weight to 100% by weight.

The polymer (P) is preferably a polymer containing both a structural unit (I) derived from a vinyl-based monomer and a structural unit (II) derived from a phosphoric acid ester-based monomer.

In the present specification, all monomer components used for producing the polymer (P) may be referred to as a monomer composition.

The structural unit (I) derived from a vinyl-based monomer is a structural unit formed when the vinyl-based monomer is polymerized as one of all monomer components used for producing the polymer (P). As the vinyl-based monomer, any appropriate vinyl-based monomer can be adopted within a range that does not impair the effect of the present invention. The vinyl-based monomer may be used alone or in combination of two or more thereof.

Examples of the vinyl-based monomer include a monofunctional vinyl-based monomer having one ethylenically unsaturated group and a polyfunctional vinyl-based monomer having two or more ethylenically unsaturated groups.

Examples of the monofunctional vinyl-based monomer having one ethylenically unsaturated group include a styrene-based monomer, a carboxyl group-containing monomer, a (meth)acrylic acid alkyl ester, a hydroxyl group-containing monomer, a nitrogen atom-containing monomer, an epoxy group-containing monomer, a sulfonic acid group-containing monomer, a phosphoric acid group-containing monomer, a (meth)acrylic acid alkoxyalkyl ester, a (meth)acrylic acid ester having an aromatic hydrocarbon group, vinyl esters, an aromatic vinyl compound, olefins, vinyl ethers, and vinyl chloride.

Examples of the styrene-based monomer include styrene, ethylvinylbenzene, α-methylstyrene, vinyltoluene, o-chlorostyrene, m-chlorostyrene, p-chlorostyrene, vinylbiphenyl, and vinylnaphthalene.

Examples of the carboxyl group-containing monomer include (meth)acrylic acid, itaconic acid, maleic acid, fumaric acid, crotonic acid, isocrotonic acid, and acid anhydrides thereof (for example, maleic anhydride or itaconic anhydride).

Examples of the (meth)acrylic acid alkyl ester include a (meth)acrylic acid alkyl ester having an alkyl group having 1 to 20 carbon atoms, such as methyl (meth)acrylate, ethyl (meth)acrylate, propyl (meth)acrylate, isopropyl (meth)acrylate, n-butyl (meth)acrylate, isobutyl (meth)acrylate, s-butyl (meth)acrylate, t-butyl (meth)acrylate, pentyl (meth)acrylate, isopentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, cyclopentyl (meth)acrylate, cyclohexyl (meth)acrylate, and isobornyl (meth)acrylate. Note that the alkyl group described herein includes an alkyl group having an alicycic hydrocarbon group or an alicyclic hydrocarbon group. Since the stability of the dispersion during suspension polymerization is excellent with the result that the hollow resin particles having high mechanical strength are likely to be obtained, the alkyl group is preferably an alkyl group having 1 to 8 carbon atoms and more preferably an alkyl group having 1 to 4 carbon atoms.

Examples of the hydroxyl group-containing monomer include a hydroxyl group-containing (meth)acrylic acid ester, vinyl alcohol, and allyl alcohol. Examples of the hydroxyl group-containing (meth)acrylic acid ester include 2-hydroxyethyl (meth)acrylate, 3-hydroxypropyl (meth)acrylate, 4-hydroxybutyl (meth)acrylate, 6-hydroxyhexyl (meth)acrylate, hydroxyoctyl (meth)acrylate, hydroxydecyl (meth)acrylate, hydroxylauryl (meth)acrylate, and (4-hydroxymethylcyclohexyl) (meth)acrylate.

The nitrogen atom-containing monomer is a monomer having at least one nitrogen atom in the molecule. In the present specification, the monomer having both a hydroxyl group and a nitrogen atom in the molecule is not included in the hydroxyl group-containing monomer, but is included in the nitrogen atom-containing monomer. Examples of the nitrogen atom-containing monomer include N-vinyl cyclic amide, (meth)acrylamides, an amino group-containing monomer, a cyano group-containing monomer, a heterocyclic ring-containing monomer, an imide group-containing monomer, and an isocyanate group-containing monomer.

Examples of the N-vinyl cyclic amide include N-vinyl-2-pyrrolidone (NVP), N-vinyl-2-piperidone, N-vinyl-3-morpholinone, N-vinyl-2-caprolactam, N-vinyl-1,3-oxazin-2-one, and N-vinyl-3,5-morpholinedione.

Examples of the (meth)acrylamides include (meth)acrylamide, N-alkyl (meth)acrylamide, N,N-dialkyl (meth)acrylamide, N-hydroxyalkyl (meth)acrylamide, and N-alkoxyalkyl (meth)acrylamide.

Examples of the N-alkyl (meth)acrylamide include N-ethyl (meth)acrylamide, N-isopropyl (meth)acrylamide, N-n-butyl (meth)acrylamide, and N-octyl (meth)acrylamide. Examples of the N-alkyl (meth)acrylamide include (meth)acrylamide having an amino group, such as dimethylaminoethyl (meth)acrylamide, diethylaminoethyl (meth)acrylamide, and dimethylaminopropyl (meth)acrylamide.

Examples of the N,N-dialkyl (meth)acrylamide include N,N-dimethyl (meth)acrylamide, N,N-diethyl (meth)acrylamide, N,N-dipropyl (meth)acrylamide, N,N-diisopropyl (meth)acrylamide, N,N-di(n-butyl) (meth)acrylamide, and N,N-di(t-butyl) (meth)acrylamide.

Examples of the N-hydroxyalkyl (meth)acrylamide include N-methylol (meth)acrylamide, N-(2-hydroxyethyl) (meth)acrylamide, N-(2-hydroxypropyl) (meth)acrylamide, N-(1-hydroxypropyl) (meth)acrylamide, N-(3-hydroxypropyl) (meth)acrylamide, N-(2-hydroxybutyl) (meth)acrylamide, N-(3-hydroxybutyl) (meth)acrylamide, N-(4-hydroxybutyl) (meth)acrylamide, and N-methyl-N-2-hydroxyethyl (meth)acrylamide.

Examples of the N-alkoxyalkyl (meth)acrylamide include N-methoxymethyl (meth)acrylamide and N-butoxymethyl (meth)acrylamide.

Examples of the amino group-containing monomer include aminoethyl (meth)acrylate, dimethylaminoethyl (meth)acrylate, dimethylaminopropyl (meth)acrylate, and t-butylaminoethyl (meth)acrylate.

Examples of the cyano group-containing monomer include acrylonitrile and methacrylonitrile.

Examples of the heterocyclic ring-containing monomer include (meth)acryloylmorpholine, N-vinylpiperazine, N-vinylpyrrole, N-vinylimidazole, N-vinylpyrazine, N-vinylmorpholine, N-vinylpyrazole, vinyl pyridine, vinyl pyrimidine, vinyl oxazole, vinyl isoxazole, vinyl thiazole, vinyl isothiazole, vinyl pyridazine, (meth)acryloylpyrrolidone, (meth)acryloylpyrrolidine, (meth)acryloylpiperidine, and N-methylvinylpyrrolidone.

Examples of the imide group-containing monomer include a maleimide-based monomer such as N-cyclohexylmaleimide, N-isopropylmaleimide, N-laurylmaleimide, and N-phenylmaleimide; an itaconimide-based monomer such as N-methylitaconimide, N-ethylitaconimide, N-butylitaconimide, N-octylitaconimide, N-2-ethylhexylitaconimide, N-laurylitaconimide, and N-cyclohexylitaconimide; and a succinimide-based monomer such as N-(meth)acryloyloxymethylenesuccinimide, N-(meth)acryloyl-6-oxyhexamethylenesuccinimide, and N-(meth)acryloyl-8-oxyoctamethylenesuccinimide.

Examples of the isocyanate group-containing monomer include 2-(meth)acryloyloxyethyl isocyanate.

Examples of the epoxy group-containing monomer include glycidyl (meth)aclyrate and methylglycidyl (meth)acrylate.

Examples of the sulfonic acid group-containing monomer include sodium vinylsulfonate.

Examples of the (meth)acrylic acid alkoxyalkyl ester include 2-methoxyethyl (meth)acrylate, 2-ethoxyethyl (meth)acrylate, methoxytriethyleneglycol (meth)acrylate, 3-methoxypropyl (meth)acrylate, 3-ethoxypropyl (meth)acrylate, 4-methoxybutyl (meth)acrylate, and 4-ethoxybutyl (meth)acrylate.

Examples of the (meth)acrylic acid ester having an aromatic hydrocarbon group include phenyl (meth)acrylate, phenoxyethyl (meth)acrylate, and benzyl (meth)acrylate.

Examples of the vinyl esters include vinyl acetate and vinyl propionate.

Examples of the aromatic vinyl compound include styrene and vinyl toluene.

Examples of the olefins include ethylene, butadiene, isoprene, and isobutylene.

Examples of the vinyl ethers include vinyl alkyl ether.

Examples of the polyfunctional vinyl-based monomer having two or more ethylenically unsaturated groups include a polyfunctional (meth)acrylic acid ester-based monomer and an aromatic divinyl-based monomer.

Examples of the polyfunctional (meth)acrylic acid ester-based monomer include ethylene glycol di(meth)acrylate, diethylene glycol di(meth)acrylate, triethylene glycol di(meth)acrylate, tetraethylene glycol di(meth)acrylate, nonaethylene glycol di(meth)acrylate, tetradecaethylene glycol di(meth)acrylate, decaethylene glycol di(meth)acrylate, pentadecaethylene glycol di(meth)acrylate, 1,3-butylene glycol di(meth)acrylate, 1,4-butanediol di(meth)acrylate, 1,6-hexanediol di(meth)acrylate, glycerin di(meth)acrylate, trimethylol propane tri(meth)acrylate, pentaerythritol tetra(meth)acrylate, phthalic acid diethylene glycol di(meth)acrylate, caprolactone-modified dipentaerythritol hexa(meth)acrylate, caprolactone-modified hydroxypivalic acid ester neopentyl glycol di(meth)acrylate, polyester (meth)acrylate, and urethane (meth)acrylate.

Examples of the aromatic divinyl-based monomer include divinyl benzene, divinyl naphthalene, and derivatives thereof.

From the viewpoint of further exerting the effect of the present invention, the vinyl-based monomer preferably contains a polyfunctional vinyl-based monomer. A content ratio of the polyfunctional vinyl-based monomer in the total amount of the vinyl-based monomer is preferably 3% by weight to 70% by weight, more preferably 5% by weight to 50% by weight, still more preferably 7% by weight to 45% by weight, and particularly preferably 10% by weight to 40% by weight, from the viewpoint of further exerting the effect of the present invention. When the content ratio of the polyfunctional vinyl-based monomer in the total amount of the vinyl-based monomer is too small out of the above range, it may be difficult to form a hole portion inside the particle. When the content ratio of the polyfunctional vinyl-based monomer in the total amount of the vinyl-based monomer is too large out of the above range, shrinkage of a surface of the obtained hollow resin particle (2) may increase, and the mechanical strength may decrease.

The structural unit (II) derived from a phosphoric acid ester-based monomer is a structural unit formed when the phosphoric acid ester-based monomer is polymerized as one of all monomer components used for producing the polymer (P). As the phosphoric acid ester-based monomer, any appropriate phosphoric acid ester-based monomer can be adopted within a range that does not impair the effect of the present invention. The phosphoric acid ester-based monomer may be used alone or in combination of two or more thereof.

The phosphoric acid ester-based monomer preferably has an ethylenically unsaturated group from the viewpoint of increasing particle hardness by copolymerization with a vinyl-based monomer near the droplet surface during suspension polymerization.

The phosphoric acid ester-based monomer is preferably an acidic phosphoric acid ester-based monomer from the viewpoint of easily orienting the particles to the droplet surface during suspension polymerization and increasing the hardness near the particle surface by action with an inorganic dispersing agent.

The acidic phosphoric acid ester-based monomer having an ethylenically unsaturated group is preferably a phosphoric acid ester-based monomer represented by formula (1) from the viewpoint of further exerting the effect of the present invention.

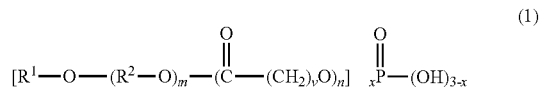

(1)

In formula (1), $R^1$ is a (meth)acryl group or an allyl group, $R^2$ is a linear or branched alkylene group, m is an integer of 1 to 30, n is 0 or 1, v is an integer of 1 to 10, and x is 1 or 2.

From the viewpoint of further exerting the effect of the present invention, the phosphoric acid ester-based monomer represented by formula (1) is preferably caprolactone EO-modified phosphoric acid dimethacrylate represented by formula (2), polyoxypropylene allyl ether phosphoric acid ester represented by formula (3), and 2-methacryloyloxyethyl acid phosphate.

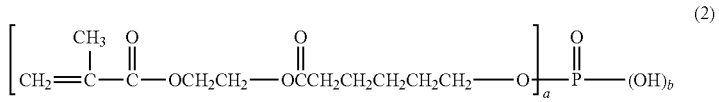

In formula (2), a and b are a=1 and b=2 or a=2 and b=1.

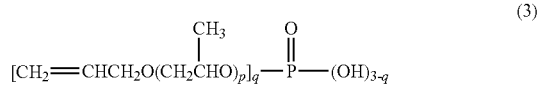

In formula (3), p is an integer of 1 to 30. Q is 1 or 2.

As the caprolactone EO-modified phosphoric acid dimethacrylate represented by formula (2), for example, trade name "KAYAMER PM-21" manufactured by Nippon Kayaku Co., Ltd. can be commercially available.

As the polyoxypropylene allyl ether phosphoric acid ester represented by formula (3), for example, a product name "Adeka Reasoap PP-70" manufactured by ADEKA Corporation can be commercially available.

In the hollow resin particles (2), when the polymer (P) as a main component is a polymer containing both a structural unit (I) derived from a vinyl-based monomer and a structural unit (II) derived from a phosphoric acid ester-based monomer, the phosphoric acid ester-based monomer is contained in all monomer components used for producing the polymer in an amount of preferably 0.001 parts by weight to 5 parts by weight, more preferably 0.01 parts by weight to 3 parts by weight, still more preferably 0.03 parts by weight to 1 part by weight, and particularly preferably 0.05 parts by weight to 0.8 parts by weight, with respect to 100 parts by weight of the vinyl-based monomer. When the content of the phosphoric acid ester-based monomer with respect to 100 parts by weight of the vinyl-based monomer is within the above range, the effect of the present invention can be further exerted.

In addition to the polymer (P) containing at least one selected from the group consisting of a structural unit (I) derived from a vinyl-based monomer and a structural unit (II) derived from a phosphoric acid ester-based monomer, the hollow resin particles (2) may also contain any appropriate additional components within a range that does not impair the effect of the present invention. The additional components may be used alone or in combination of two or more thereof. Examples of the additional components include a pigment, an antioxidant, a flavor, an ultraviolet protective agent, a surfactant, a preservative, and a medicinal ingredient.

<Production Method of Hollow Resin Particles (2) According to Preferred Embodiment>

The hollow resin particles (2) can be produced by any appropriate method within a range that does not impair the effect of the present invention.

Such a production method includes, for example, a dispersion step (Step 1), a polymerization step (Step 2), a washing step (Step 3), and a drying step (Step 4).

[Step 1: Dispersion Step]

Step 1 is a step of dispersing an organic mixed solution containing a monomer composition containing at least one selected from the group consisting of a vinyl-based monomer and a phosphoric acid ester-based monomer, a polymerization initiator, and a non-polymerizable organic compound in an aqueous solution containing a dispersing agent.

The dispersion of the organic mixed solution in the aqueous solution may employ any appropriate dispersion method as long as the organic mixed solution can be present in the form of droplets in the aqueous solution within a range that does not impair the effect of the present invention. Such a dispersion method is typically a dispersion method using a homomixer or a homogenizer.

The aqueous solution contains an aqueous medium and a dispersing agent.

Examples of the aqueous medium include water, a mixed medium of water and a lower alcohol (methanol, ethanol, or the like), and the like. The water is preferably at least one selected from deionized water, ion-exchanged water, and distilled water.

As the dispersing agent, any appropriate dispersing agent can be adopted within a range that does not impair the effect of the present invention. Examples of the dispersing agent include an inorganic dispersing agent and a surfactant. From the viewpoint of further exerting the effect of the present invention, an inorganic dispersing agent is preferably employed as the dispersing agent. The dispersing agent may be used alone or in combination of two or more thereof.

Examples of the inorganic dispersing agent include a poorly water-soluble salt such as a pyrophosphoric acid salt of alkaline earth metal (such as magnesium pyrophosphate and the like), a phosphoric acid salt of alkaline earth metal (such as tertiary calcium phosphate and the like), calcium carbonate, or barium carbonate; an inorganic dispersing agent such as silica or zirconium oxide; and an inorganic polymer substance such as talc, bentonite, silicic acid, diatomaceous earth, or viscosity. The alkaline earth metal described herein is preferably magnesium or calcium. Among them, the pyrophosphoric acid salt of alkaline earth metal and the phosphoric acid salt of alkaline earth metal are preferable, in that metal ions interact with the phosphoric acid ester moiety in the phosphoric acid ester-based monomer to form a dense coating on the surface layer, and as a result, the hollow resin particles having high mechanical strength can be obtained.

The amount of the inorganic dispersing agent added is preferably 0.1 parts by weight to 30 parts by weight, and more preferably 0.5 parts by weight to 20 parts by weight, with respect to 100 parts by weight of the monomer composition (all monomer components used for producing the polymer (P) as the main component of the hollow resin particles) from the viewpoint of securing stability of oil droplets and obtaining hollow resin particles having a uniform particle diameter.

Examples of the surfactant include an anionic surfactant, a cationic surfactant, an amphoteric surfactant, a nonionic surfactant, and the like.

Examples of the anionic surfactant include a non-reactive anionic surfactant such as alkyl sulfate ester fatty acid salt, alkylbenzenesulfonic acid salt, alkylnaphthalenesulfonic acid salt, alkanesulfonic acid salt, alkyl diphenyl ether sulfonic acid salt, dialkylsulfosuccinic acid salt, monoalkylsulfosuccinic acid salt, and polyoxyethylene alkyl phenyl ether phosphoric acid salt; a reactive anionic surfactant such as polyoxyethylene-1-(allyloxymethyl)alkyl ether sulfate ester ammonium salt, polyoxyethylene alkyl propenyl phenyl ether sulfate ester ammonium salt, and ammonium polyoxyalkylene alkenyl ether sulfate; and the like.

Examples of the cationic surfactant include a cationic surfactant such as alkyltrimethylammonium salt, alkyltriethylammonium salt, dialkyldimethylammonium salt, dialkyldiethylammonium salt, N-polyoxyalkylene-N,N,N-trialkylammonium salt, and the like.

Examples of the amphoteric surfactant include lauryldimethylamine oxide, a phosphoric acid ester salt, a phosphorus acid ester-based surfactant, and the like.

Examples of the nonionic surfactant include polyoxyethylene alkyl ether, polyoxyethylene alkyl phenyl ether, polyoxyethylene fatty acid ester, sorbitan fatty acid ester, polysorbitan fatty acid ester, polyoxyethylene alkylamine, glycerin fatty acid ester, an oxyethylene-oxypropylene block polymer, and the like.

The amount of the surfactant added is preferably 0.01 parts by weight to 1 part by weight with respect to 100 parts by weight of the organic mixed solution. The surfactant may be used alone or in combination of two or more thereof.

The aqueous solution may contain any appropriate additional components within a range that does not impair the effect of the present invention.

The organic mixed solution contains a monomer composition containing at least one selected from the group consisting of a vinyl-based monomer and a phosphoric acid ester-based monomer, a polymerization initiator, and a non-polymerizable organic compound.

As the monomer composition contained in the organic mixed solution, the description in the section of <Hollow resin particles (2) according to preferred embodiment> can be incorporated as it is.

As the polymerization initiator, any appropriate polymerization initiator can be adopted within a range that does not impair the effect of the present invention.

The polymerization initiator preferably has a 10-hour half-life temperature of 90° C. or lower. When such a polymerization initiator is used, the polymerization initiator remaining in the hollow resin particles (2) can be completely decomposed, and for example, when a semiconductor member containing the hollow resin particles (2) is heated by solder reflow or the like, oxidation degradation of the resin and gas generation due to the remaining polymerization initiator can be suppressed.

The polymerization initiator is preferably polymerized with a combination of a reaction temperature and a reaction time at which a decomposition rate of the polymerization initiator calculated by the following formula is 98% or more. Under such polymerization conditions, the polymerization initiator remaining in the hollow resin particles (2) can be completely decomposed, and for example, when a semiconductor member containing the hollow resin particles (2) is heated by solder reflow or the like, oxidation degradation of the resin and gas generation due to the remaining polymerization initiator can be suppressed.

Decomposition rate (%)=(1−exp(−$k_d t$))×100

$kd = A \exp(-\Delta E/RT)$

In the formula, $k_d$ represents the pyrolysis rate constant, t represents a reaction time (hr), A represents a frequency factor ($hr^{-1}$), ΔE represents an activation energy (J/mol), R represents a gas constant (8.314 J/mol K), and T represents a reaction temperature (K).

Examples of the polymerization initiator include an organic peroxide such as lauroyl peroxide, benzoyl peroxide, ortho-chlorobenzoyl peroxide, ortho-methoxy benzoyl peroxide, 3,5,5-trimethylhexanoyl peroxide, t-butylperoxy-2-ethylhexanoate, or di-t-butyl peroxide; an azo-based compound such as 2,2'-azobisisobutyronitrile, 1,1'-azobiscyclohexanecarbonitrile, 2,2'-azobis(2,4-dimethylvaleronitrile); and the like.

The amount of the polymerization initiator added is preferably 0.01 parts by weight to 10 parts by weight, more preferably 0.01 parts by weight to 5 parts by weight, and still more preferably 0.1 parts by weight to 5 parts by weight, with respect to 100 parts by weight of the monomer composition (all monomer components used for producing the polymer (P) as the main component of the hollow resin particles). The polymerization initiator may be used alone or in combination of two or more thereof.

The non-polymerizable organic compound has a function as a so-called solvent and also contributes to formation of a hole portion having a porous structure or a single hollow structure inside the hollow resin particle (2).

As the non-polymerizable organic compound, an organic solvent having a boiling point of 30° C. or higher and 200° C. or lower is preferably used because the non-polymerizable organic compound is present as a liquid in a temperature range in which the polymerization step (Step 2) is performed. More specifically, as the non-polymerizable organic compound, one or more selected from the group consisting of a saturated aliphatic hydrocarbon such as n-pentane, isopentane, n-hexane, cyclohexane, or n-heptane; an aromatic compound such as toluene or benzene; an acetic acid ester-based compound such as ethyl acetate or butyl acetate; and a fluorine-based compound such as hydrofluoroether or hydrofluorocarbon can be used.

The amount of the non-polymerizable organic compound added is preferably 10 parts by weight to 250 parts by weight with respect to 100 parts by weight of the monomer composition (all monomer components used for producing the polymer (P) as the main component of the hollow resin particles) from the viewpoint of further exerting the effect of the present invention. When the amount of the non-polymerizable organic compound used with respect to 100 parts by weight of the monomer composition is too small out of the above range, a hole portion having a porous structure or a single hollow structure cannot be reliably formed inside the hollow resin particle (2). When the amount of the non-polymerizable organic compound used with respect to 100 parts by weight of the monomer composition is too large out of the above range, sufficient strength cannot be applied to the obtained hollow resin particles (2).

The organic mixed solution may contain any appropriate additional components within a range that does not impair the effect of the present invention.

[Step 2: Polymerization Step]

Step 2 is a step of performing suspension polymerization by heating a dispersion liquid obtained in Step 1.

As a polymerization temperature, any appropriate polymerization temperature can be adopted as long as the polymerization temperature is a temperature suitable for suspension polymerization within a range that does not impair the effect of the present invention. The polymerization temperature is preferably 30° C. to 105° C.

As a polymerization time, any appropriate polymerization time can be adopted as long as the polymerization time is a time suitable for suspension polymerization within a range that does not impair the effect of the present invention. The polymerization time is preferably 0.1 hours to 20 hours.

Post-heating preferably performed after polymerization is a preferred treatment for obtaining highly completed hollow resin particles.

As a temperature of the post-heating that is preferably performed after polymerization, any appropriate temperature can be adopted within a range that does not impair the effect of the present invention. The temperature of the post-heating is preferably 50° C. to 120° C.

As a time of the post-heating that is preferably performed after polymerization, any appropriate time can be adopted within a range that does not impair the effect of the present invention. The time of the post-heating is preferably 1 hour to 10 hours.

[Step 3: Washing Step]

Step 3 is a step of washing the slurry obtained in Step 2.

As a washing method, any appropriate washing method can be adopted within a range that does not impair the effect of the present invention. Examples of the washing method include (1) a method of removing impurities after forming hollow resin particles (2) by repeating multiple times an operation of depositing the hollow resin particles using a high-speed centrifuge or the like with extraordinarily high centrifugal acceleration, removing the supernatant, and newly adding ion-exchanged water or distilled water to disperse the deposited hollow resin particles (2) in the ion-exchanged water; (2) a method of removing impurities by performing washing by a cross-flow filtration method using a ceramic filter or the like; (3) a method of adding, to hollow resin particles (2), a solvent to serve as an aggregating agent of particles thereby to cause particles to aggregate and settle in the solvent, separating the hollow resin particles (2) using a filter or the like, and washing the particles with a washing solvent; and the like.

In the washing method of (1) above, it is preferable to perform washing using ion-exchanged water or distilled water in an amount of 5 times or more the amount of the slurry.

The hollow resin particles (2) having a small specific gravity are preferably washed by a cross-flow filtration method using the ceramic filter of (2) or the like.

[Step 4: Drying Step]

Step 4 is a step of drying the slurry after washing obtained in Step 3.

As a drying method, any appropriate drying method can be adopted within a range that does not impair the effect of the present invention. Examples of the drying method include drying by heating.

As a temperature of the heating, any appropriate temperature can be adopted within a range that does not impair the effect of the present invention. The temperature of the heating is preferably 50° C. to 120° C.

As a time of the heating, any appropriate time can be adopted within a range that does not impair the effect of the present invention. The time of the heating is preferably 1 hour to 50 hours.

<Hollow Resin Particles (3) According to Preferred Embodiment and Production Method of the Same>

The hollow resin particles (3) are multi-hollow resin particles having two or more independent hole portions inside the particle. As the multi-hollow resin particles, any appropriate multi-hollow resin particles can be adopted within a range that does not impair the effect of the present invention. Examples of the multi-hollow resin particles and a production method of the same include multi-hollow resin particles described in Japanese Patent No. 4566870.

<<Other Additives>>

The resin layer (A) may contain other additives. The other additives may be used alone or in combination of two or more thereof.

As the other additives, any appropriate additives can be adopted within a range that does not impair the effect of the present invention. Examples of the other additives include a coupling agent, a curing accelerator, a curing agent, an organic filler, a pigment, a dye, an antifoaming agent, a leveling agent, an ultraviolet absorber, a foaming agent, an antioxidant, a flame retardant, and an ion scavenger.

As the curing agent, any appropriate curing agent can be adopted within a range that does not impair the effect of the present invention. Examples of the curing agent include a curing agent generally used for production of a laminate used for a core layer of a circuit board, and examples thereof include a phenol-based curing agent, an amine-based curing agent, an acid anhydride-based curing agent, a mercaptan-based curing agent, an isocyanate compound such as an isocyanate prepolymer or a blocked isocyanate, and organic acids such as a carboxylic acid-containing polyester resin. Among these curing agents, a phenol-based curing agent is preferable from the viewpoint of the balance among flame resistance, moisture resistance, electrical characteristics, curability, storage stability, and the like.

Examples of the phenol-based curing agent include a novolac resin (such as a phenol novolac resin, a cresol novolac resin, or the like) obtained by condensation or co-condensation of phenols such as phenol, cresol, resorcinol, catechol, bisphenol A, bisphenol F, phenylphenol, aminophenol, α-naphthol, 8-naphthol, and dihydroxynaphthalene and formaldehyde or ketones in the presence of an acidic catalyst; a phenol aralkyl resin such as a phenol aralkyl resin having a biphenylene skeleton synthesized from the above phenols and dimethoxyparaxylene or bis (methoxymethyl)biphenyl, or a phenol aralkyl resin having a phenylene skeleton; and a phenol resin having a trisphenolmethane skeleton.

Examples of the amine-based curing agent include an aliphatic polyamine such as diethylenetriamine (DETA), triethylenetetramine (TETA), or meta-xylylenediamine (MXDA); an aromatic polyamine such as diaminodiphenylmethane (DDM), m-phenylenediamine (MPDA), or diaminodiphenyl sulfone (DDS); and a polyamine compound containing dicyandiamide (DICY), an organic acid dihydrazide, and the like.

Examples of the acid anhydride-based curing agent include an alicyclic acid anhydride such as hexahydrophthalic anhydride (HHPA), methyltetrahydrophthalic anhydride (MTHPA), or maleic anhydride; and an aromatic anhydride such as trimellitic anhydride (TMA), pyromellitic anhydride (PMDA), benzophenonetetracarboxylic acid (BTDA), phthalic anhydride, and the like.

Examples of the mercaptan-based curing agent include trimethylolpropane tris(3-mercaptobutyrate) and trimethylolethane tris(3-mercaptobutyrate).

The curing agent is contained in the resin composition (a) in an amount of preferably 0.1% by weight to 20% by weight, more preferably 0.5% by weight to 15% by weight, still more preferably 1.0% by weight to 10% by weight, and particularly preferably 1.5% by weight to 8% by weight, with respect to the total solid content of the resin composition (a). When the content of the curing agent in the resin composition (a) with respect to the total solid content of the resin composition (a) is within the above range, the effect of the present invention can be further exerted.

As the coupling agent, any appropriate coupling agent can be adopted within a range that does not impair the effect of the present invention. Examples of the coupling agent include a silane-based compound; a titanium-based compound; aluminum chelates; and an aluminum/zirconium-based compound.

Examples of the silane-based compound include hydrolysis products of vinyltrichlorosilane, vinyltrimethoxysilane, vinyltriethoxysilane, vinyltris(ß-methoxyethoxy)silane, γ-methacryloxypropyltrimethoxysilane, ß-(3,4-epoxycyclohexyl)ethyltrimethoxysilane, γ-glycidoxypropyltrimethoxysilane, γ-glycidoxypropyltriethoxysilane, γ-glycidoxypropylmethyldimethoxysilane, γ-methacryloxypropylmethyldiethoxysilane, γ-methacryloxypropyltriethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(ß-hydroxyethyl)]aminopropyltriethoxysilane, N-ß-(aminoethyl)-γ-aminopropyltrimethoxysilane, N-ß-(aminoethyl)-γ-aminopropyltriethoxysilane, N-ß-(aminoethyl)-γ-aminopropylmethyldimethoxysilane, phenylaminopropyltrimethoxysilane, γ-(ß-aminoethyl)aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-ß-(N-vinylbenzylaminoethyl)-γ-aminopropyltrimethoxysilane, γ-chloropropyltrimethoxysilane, hexamethyldisilane, vinyltrimethoxysilane, γ-mercaptopropylmethyldimethoxysilane, 3-isocyanatopropyltriethoxysilane, 3-acryloxypropyltrimethoxysilane, and 3-triethoxysilyl-N-(1,3-dimethylbutylidene)propylamine.

Examples of the titanium-based compound include isopropyltriisostearoyl titanate, isopropyl tris(dioctyl pyrophosphate)titanate, isopropyl tri(N-aminoethyl-aminoethyl) titanate, tetraoctyl bis(ditridecylphosphite)titanate, tetra(2, 2-diallyloxymethyl-1-butyl)bis(ditridecyl)phosphite titanate, bis(dioctyl pyrophosphate)oxyacetate titanate, bis(dioctyl pyrophosphate)ethylene titanate, isopropyltrioctanoyl titanate, isopropyl dimethacryl isostearoyl titanate, isopropyl tridodecylbenzenesulfonyl titanate, isopropyl isostearoyl diacryl titanate, isopropyl tri(dioctyl phosphate) titanate, isopropyltricumylphenyl titanate, and tetraisopropyl bis(dioctyl phosphite)titanate.

The coupling agent is contained in the resin composition (a) in an amount of preferably 0.01% by weight to 5% by weight, more preferably 0.05% by weight to 3% by weight, still more preferably 0.07% by weight to 1% by weight, and particularly preferably 0.1% by weight to 0.5% by weight, with respect to the total solid content of the resin composition (a). When the content of the coupling agent in the resin composition (a) with respect to the total solid content of the resin composition (a) is within the above range, the effect of the present invention can be further exerted.

<<<<<<Laminate with Buildup Layer>>>>>>

The laminate with a buildup layer according to an embodiment of the present invention includes the laminate according to an embodiment of the present invention, and a buildup layer including a fiber base material layer and a resin layer (B) which is provided on at least one surface of the laminate layer.

In the laminate with a buildup layer according to an embodiment of the present invention, in particular, the resin layer (B) contains an inorganic filler and hollow resin particles, and the hollow resin particles are contained in the resin layer (B) in an amount of 1% by weight to 50% by weight with respect to the total amount of the resin layer (B).

<<<<Fiber Base Material Layer>>>>

For the fiber base material layer, the description of the fiber base material layer included in the laminate according to an embodiment of the present invention can be directly applied. Note that the fiber base material layer included in the buildup layer and the fiber base material layer included in the laminate according to an embodiment of the present invention may be the same as or different from each other.

<<<<Resin Layer (B)>>>>

For the resin layer (B), the description of the resin layer (A) included in the laminate according to an embodiment of the present invention can be directly applied. Note that the resin layer (B) included in the buildup layer and the resin layer (A) included in the laminate according to an embodiment of the present invention may be the same as or different from each other.

<<<<Laminate with Metal Foil>>>>

There is provided a laminate with a metal foil according to an embodiment of the present invention, in which the metal foil is formed on at least one surface of the laminate according to an embodiment of the present invention or the laminate with a buildup layer according to an embodiment of the present invention.

As a thickness of the metal foil, any appropriate thickness can be adopted within a range that does not impair the effect of the present invention. The thickness of the metal foil is preferably 1 μm to 18 μm and more preferably 2 μm to 12 μm.

Examples of a metal constituting the metal foil include copper, a copper-based alloy, aluminum, an aluminum-based alloy, silver, a silver-based alloy, gold, a gold-based alloy, zinc, a zinc-based alloy, nickel, a nickel-based alloy, tin, a tin-based alloy, iron, an iron-based alloy, Kovar (registered trademark), 42 alloy, an iron-nickel alloy, tungsten, and molybdenum. In addition, an electrolytic copper foil with a carrier or the like can also be employed.

Note that, instead of the metal foil, a resin film may be laminated on at least one surface of the laminate according to an embodiment of the present invention or the laminate with a buildup layer according to an embodiment of the present invention. Examples of the resin film include polyethylene, polypropylene, polyethylene terephthalate, polyethylene naphthalate, polyimide, and a fluorine-based resin.

As a manufacturing method of the laminate with a metal foil, any appropriate manufacturing method can be adopted within a range that does not impair the effect of the present invention. Examples of the manufacturing method of the laminate with a metal foil include a method for manufacturing a laminate, in which in a case of a laminate obtained by laminating two prepregs, a metal foil is superposed on both upper and lower surfaces or one surface of the outer side of the laminated first prepreg and second prepreg, these prepregs are bonded under high vacuum conditions using a laminator device or a Becquerel device, or a metal foil is superposed on both upper and lower surfaces or one surface of the outer side of the first prepreg and the second prepreg as they are, and then the superposed prepreg and the metal foil or the like are heated and pressurized with a vacuum press, or are heated with a dryer.

<<<<<<Circuit Board>>>>>>

A circuit board according to an embodiment of the present invention includes the laminate according to an embodiment of the present invention, the laminate with a buildup layer according to an embodiment of the present invention, or the laminate with a metal foil according to an embodiment of the present invention. A circuit board according to an embodiment of the present invention may include appropriate other members within a range that does not impair the effect of the present invention as long as the circuit board includes the laminate according to an embodiment of the present invention, the laminate with a buildup layer according to an embodiment of the present invention, or the laminate with a metal foil according to an embodiment of the present invention.

As a manufacturing method of the circuit board, any appropriate manufacturing method can be adopted within a range that does not impair the effect of the present invention. Examples of the manufacturing method of the circuit board include a method for manufacturing a circuit board, in which through-holes for interlayer connection are formed in the laminate with a metal foil, a wiring layer is produced by a subtractive method, a semi-additive method, or the like, and arbitrary buildup layers are laminated, and then a process of connecting layers and forming circuits using an additive method is repeated. Here, some or all of the buildup layers may include a fiber base material layer or may not include a fiber base material layer.

A solder resist layer may be further formed on at least one surface of the circuit board (the surface of the buildup layer when the buildup layer is formed).

EXAMPLES

Hereinafter, the present invention will be specifically described with reference to Examples, but the present invention is not limited to these Examples. Note that, unless otherwise specified, "part(s)" means "part(s) by weight", and "%" means "% by weight".

In Examples and Comparative Examples, the following raw materials were used.

Epoxy resin A: biphenylaralkyl-type novolac epoxy resin (NC-3000, manufactured by Nippon Kayaku Co., Ltd.)
Epoxy resin B: naphthalene skeleton-modified cresol novolac-type epoxy resin (EXA-7320, manufactured by DIC Corporation)
Cyanate resin A: novolac-type cyanate resin (Primaset PT-30, manufactured by Lonza K.K.)
Cyanate resin B: bisphenol A-type cyanate resin (Primaset BA230, manufactured by Lonza K.K.)
Phenol resin A: biphenyldimethylene-type phenol resin (GPH-103, manufactured by Nippon Kayaku Co., Ltd.)
Phenoxy resin A: phenoxy resin having bisphenol acetophenone structure Inorganic filler A: spherical silica (SO-32R, manufactured by Admatechs Company Limited, average particle diameter 1 μm)
Coupling agent A: γ-glycidoxypropyltrimethoxysilane (A187, manufactured by GE Toshiba Silicones Co., Ltd.)
Curing catalyst A: phosphorus-based catalyst of onium salt compound (C05-MB, manufactured by Sumitomo Bakelite Co., Ltd.)
Curing catalyst B: dicyandiamide
Colorant A: phthalocyanine blue/benzimidazolone/methyl ethyl ketone (=1/1/8) mixture (manufactured by Sanyo Color Works, Ltd.)

<Measurement of Volume Average Particle Diameter>

A volume average particle diameter of the particles was measured by a Coulter method as follows.

The volume average particle diameter of the particles was measured by a Coulter Multisizer (registered trademark) 3 (measuring apparatus, manufactured by Beckman Coulter, Inc.). The measurement was performed using an aperture calibrated according to Multisizer (registered trademark) 3 User's Manual published by Beckman Coulter, Inc. Note that the aperture used for the measurement was appropriately selected according to the size of the particle to be measured. Current (aperture current) and Gain were appropriately set according to the size of the selected aperture. For example, when an aperture having a size of 50 μm was selected, Current (aperture current) was set to −800, and Gain was set to 4.

As a measurement sample, a dispersion obtained by dispersing 0.1 g of the particles in 0.1% by weight of a 10 ml nonionic surfactant aqueous solution using a touch mixer ("TOUCHMIXER MT-31", manufactured by Yamato Scientific Co., Ltd.) and an ultrasonic cleaner ("ULTRASONIC CLEANER VS-150", manufactured by Velvo-Clear Co., Ltd.) was used. During the measurement, the inside content of the beaker was gently stirred to such an extent that air bubbles did not enter, and the measurement was terminated when 100,000 particles were measured. Note that the volume average particle diameter of the particles was an arithmetic average in a particle diameter distribution of 100,000 particles on a volume basis.

<Bulk Specific Gravity>

A bulk specific gravity of the particles was measured in accordance with JIS K5101-12-1 (Pigment test method-Part 12: Apparent density or apparent specific volume-Section 1: Static setting method).

<Specific Surface Area>

A specific surface area of the particles was measured by the BET method (nitrogen adsorption method) described in JIS Z 8830:2001 of ISO 9277, the first edition. A BET nitrogen adsorption isotherm of target particles was measured using an automatic specific surface area/pore distribution measuring apparatus "Tristar II" manufactured by Shimadzu Corporation, and the specific surface area was calculated from the nitrogen adsorption amount using a BET multipoint method.

After a pre-treatment by heating gas purge was performed, measurement was performed using nitrogen as an adsorbent under a condition of an adsorbent cross-sectional area of 0.162 $nm^2$ by a constant volume method. Note that the pre-treatment was specifically performed by performing nitrogen purge for 20 minutes while heating a container containing the particles at 65° C., allowing the container to cool to room temperature, and then performing vacuum degassing until the pressure in the container became 0.05 mmHg or less while heating the container at 65° C.

<TEM Measurement: Observation of Hollow Resin Particles>

Hollow resin particles as a dry powder were subjected to a surface treatment (10 Pa, 5 mA, 10 seconds) using a coating apparatus "Osmium Coater Neoc-Pro" manufactured by Meiwafosis Co., Ltd. Next, the hollow resin particles were observed with a transmission electron microscope (TEM) (H-7600 manufactured by Hitachi High-Technologies Corporation), and the presence or absence of the hollow and the shape of the hollow resin particles were confirmed. At this time, an acceleration voltage was set to 80 kV, and a magnification was set to 5,000 times or 10,000 times.

<SEM Observation>

The particles were imaged with a scanning electron microscope (SEM) to obtain a surface SEM image. Further, the particles were embedded in an epoxy resin and then cut into a thin film piece, and a cross section of the particle was imaged with a scanning electron microscope (SEM) to obtain a cross-sectional SEM image.

[Production Example 1]: Production of Porous Hollow Resin Particles (1)

105 parts by weight of methyl methacrylate, 45 parts by weight of trimethylolpropane trimethacrylate, 0.3 parts by weight of "KAYAMER (registered trademark) PM-21" (manufactured by Nippon Kayaku Co., Ltd.) as a polymerizable monomer having an acidic phosphoric acid ester group, 0.75 parts by weight of 2,2'-azobis(2,4-dimethylvaleronitrile) as a polymerization initiator (trade name "ABN-V", manufactured by Japan Finechem Company, Inc., 10-hour half-life temperature=51° C., activation energy ΔE=122.7 kJ/mol, frequency factor A=1.80×10$^{18}$ hr$^{-1}$), 75 parts by weight of ethyl acetate as a non-polymerizable organic compound, and 75 parts by weight of cyclohexane were mixed to prepare an oil phase.

In addition, 900 parts by weight of deionized water as an aqueous medium and 23 parts by weight of magnesium pyrophosphate produced by a double decomposition method as a dispersing agent were mixed to prepare an aqueous phase.

Next, the oil phase was dispersed in the aqueous phase at 8,000 rpm for 5 minutes using TK-homomixer (manufactured by PRIMIX Corporation) to obtain a dispersion having a volume average particle diameter of about 8 μm. Thereafter, the dispersion was placed in a polymerization apparatus equipped with a stirrer and a thermometer, the internal temperature of the polymerization apparatus was raised to 55° C., stirring was continued for 5 hours, the internal temperature of the polymerization apparatus was raised to 70° C. (secondary temperature rise), and then the suspension was stirred at 70° C. for 7 hours (decomposition rate of ABN-V=99.57%), thereby completing the suspension polymerization reaction.

After cooling the obtained suspension, the dispersing agent (magnesium pyrophosphate) contained in the suspension was decomposed with hydrochloric acid. Thereafter, the suspension was dehydrated by filtration to separate a solid content, and the solid content was washed with sufficient water. Thereafter, the non-polymerizable organic compound was removed by vacuum drying at 70° C. for 24 hours to obtain spherical resin particles.

The volume average particle diameter of the obtained resin particles was 7.8 μm. According to SEM observation, the obtained resin particles were porous hollow resin particles (1) having a porous shape inside. The bulk specific gravity of the porous hollow resin particles (1) was 0.33 g/ml.

The specific surface areas of the porous hollow resin particles (1) before and after treatment with a jet mill at a pressure of 0.4 MPa were 8.2 m$^2$/g and 23.2 m$^2$/g, respectively. This indicates that the smaller the numerical difference in specific surface area between before and after the treatment with the jet mill, the more sufficient the durability of the particles against the impact of the jet mill, which means that the particles are not destroyed by external forces such as shear force and pressure at the time of manufacturing a semiconductor member.

Figure 2:
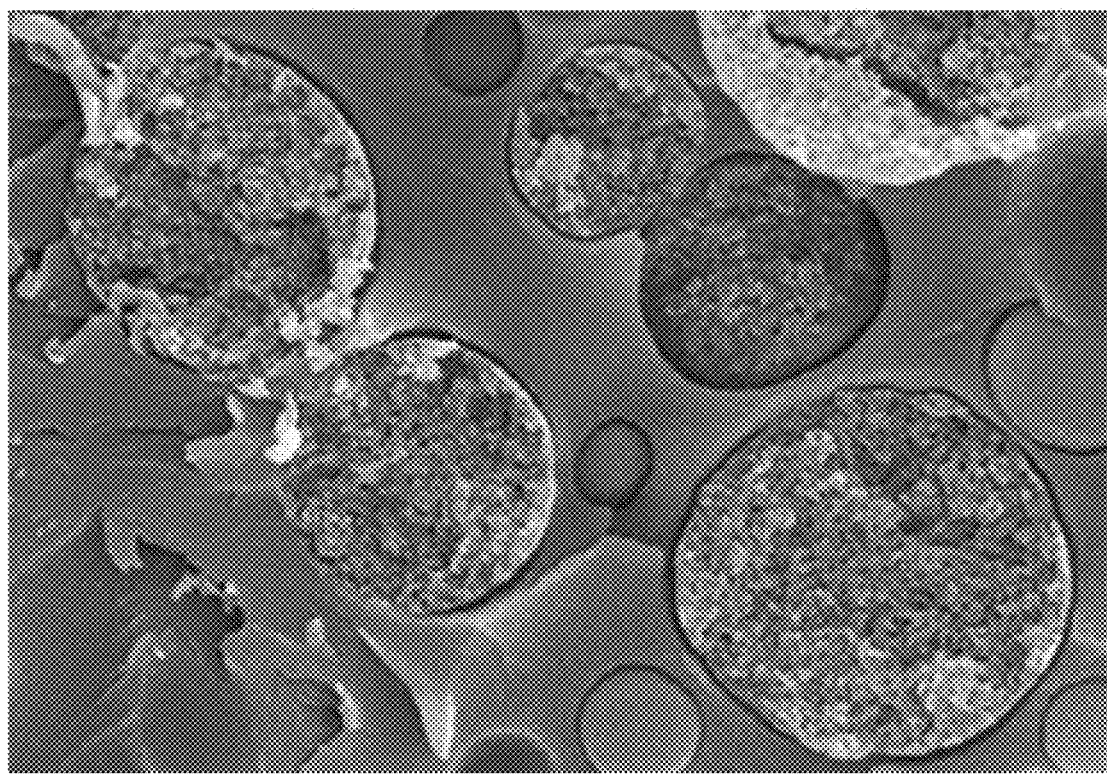
FIG. 2 is a cross-sectional SEM image of the porous hollow resin particles (1) obtained in Production Example 1.

FIG. 1 shows the surface SEM image of the porous hollow resin particle (1). FIG. 2 shows the cross-sectional surface SEM image of the porous hollow resin particle (1). In the resin particles (1) produced using a (meth)acrylic acid alkyl ester and a polyfunctional (meth)acrylic acid ester-based monomer, it was confirmed that the particle surface was a dense shell without pores, and the inside of the particle had a porous structure.

[Production Example 2] Preparation of Resin Varnish A 11.0 parts by weight of a biphenylaralkyl-type novolac epoxy resin (NC-3000, manufactured by Nippon Kayaku Co., Ltd.) as the epoxy resin A, 8.8 parts by weight of a biphenyldimethylene-type phenol resin (GPH-103, manufactured by Nippon Kayaku Co., Ltd.) as the phenol resin A, 16.0 parts by weight of a novolac-type cyanate resin (Primaset PT-30, manufactured Lonza Japan Ltd.) as the cyanate resin A, and 4.0 parts by weight of a bisphenol A-type cyanate resin (Primaset BA230, manufactured by Lonza Japan Ltd.) as the cyanate resin B were dissolved and dispersed in methyl ethyl ketone. Further, 20.0 parts by weight of the porous hollow resin particles (1) obtained in Production Example 1, 40.0 parts by weight of spherical silica (SO-32R, manufactured by Admatechs Company Limited, average particle diameter 1 μm) as the inorganic filler A, and 0.2 parts by weight of γ-glycidoxypropyltrimethoxysilane (A187, manufactured by GE Toshiba Silicones Co., Ltd.) as the coupling agent A were added, stirring was performed using a high-speed stirrer for 30 minutes, and adjustment was performed so that a non-volatile content was 50% by weight, thereby preparing a resin varnish A as a varnish of a resin composition.

The resin varnish A was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 2.69, and the dielectric loss tangent was 0.0216.

[Production Example 3]: Production of Carrier Materials A and B

The resin varnish A prepared in Production Example 2 was applied onto a PET film (polyethylene terephthalate, manufactured by Teijin DuPont Film Co., Ltd., Purex film, thickness 36 μm) using a die coater so that a thickness of a resin layer after drying was 13.0 μm, and then drying was performed in a drying apparatus at 160° C. for 5 minutes, thereby obtaining a resin sheet A with a PET film (carrier material A) for a first resin layer. In addition, the resin varnish A prepared in Production Example 2 was applied onto a PET film (polyethylene terephthalate, manufactured by Teijin DuPont Film Co., Ltd., Purex film, thickness 36 μm) in the same manner so that a thickness of a resin layer after drying was 7.0 μm, and then drying was performed in a dryer at 160° C. for 5 minutes, thereby obtaining a resin sheet B with a PET film (carrier material B) for a second resin layer.

[Production Example 4]: Production of Prepreg 1 (P1)

The carrier material A and the carrier material B produced in Production Example 3 were placed on both surfaces of a glass fiber base material (thickness 15 μm, manufactured by Unitika Glass Fiber Co., Ltd., E glass fabric, E02Z 04 53SK, IPC standard 1015, coefficient of linear expansion: 5.5 ppm/° C.) so that each resin layer faced the glass fiber base material, and then the glass fiber base material was impregnated with a resin composition by a vacuum laminator and a hot air drying apparatus, thereby obtaining a prepreg on which a PET film was laminated.

Specifically, the carrier material A and the carrier material B were respectively superposed on both surfaces of the glass fiber base material so that the carrier material A and the carrier material B were positioned at the center in a width direction of the glass fiber base material, and bonding was performed at 80° C. using a laminate roll under a condition of reducing the pressure from normal pressure to 9.999×10$^4$ Pa (about 750 Torr) or more.

Here, in the inner region of the width direction dimension of the glass fiber base material, the resin layers of the carrier material A and the carrier material B were bonded to both surface sides of the glass fiber base material, and in the outer region of the width direction dimension of the glass fiber base material, the resin layers of the carrier material A and the carrier material B were bonded to each other.

Next, the bonded resin layers were passed through a horizontal conveyance type hot air drying apparatus set at 120° C. for 2 minutes to be heat-treated without applying pressure, thereby obtaining a prepreg 1 (P1). At this time, a thickness (C1) of the first resin layer was 9 μm, a thickness of the glass fiber base material layer was 15 μm, a thickness (C2) of the second resin layer was 3 μm, the total thickness was 27 μm, and C2/C1 was 0.33. Note that the thickness of the resin layer was measured by cutting out a cross section of the prepreg 1 (P1) and observing the cut cross section with an optical microscope.

[Production Example 5] Preparation of Resin Varnish G 25 parts by weight of a novolac-type cyanate resin (Primaset PT-30, manufactured by Lonza Japan Ltd.) as the cyanate resin A, 25 parts by weight of a biphenylaralkyl-type novolac epoxy resin (NC-3000, manufactured by Nippon Kayaku Co., Ltd.) as the epoxy resin A, 10 parts by weight of the phenoxy resin having a bisphenol acetophenone structure prepared above as the phenoxy resin A, and 0.4 parts by weight of an imidazole compound (1-benzyl-2-phenylimidazole, manufactured by Shikoku Chemicals Corporation) as the curing accelerator were dissolved and dispersed in methyl ethyl ketone. Further, 20.0 parts by weight of the porous hollow resin particles (1) obtained in Production Example 1, 19.4 parts by weight of spherical silica (SO-32R, manufactured by Admatechs Company Limited, average particle diameter 1 μm) as the inorganic filler A, and 0.2 parts by weight of γ-glycidoxypropyltrimethoxysilane (A187, manufactured by GE Toshiba Silicones Co., Ltd.) as the coupling agent A were added, stirring was performed using a high-speed stirrer for 30 minutes, and adjustment was performed so that a non-volatile content was 50% by weight, thereby preparing a resin varnish G as a varnish of a resin composition.

The resin varnish G was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 2.85, and the dielectric loss tangent was 0.0187.

[Production Example 6]: Production of Carrier Materials C and D

The resin varnish G prepared in Production Example 5 was applied onto a PET film (polyethylene terephthalate, manufactured by Teijin DuPont Film Co., Ltd., Purex film, thickness 36 μm) using a die coater so that a thickness of a resin layer after drying was 22.0 μm, and then drying was performed in a drying apparatus at 160° C. for 5 minutes, thereby obtaining a resin sheet C with a PET film (carrier material C) for a first resin layer.

In addition, the resin varnish G prepared in Production Example 5 was applied onto a PET film (polyethylene terephthalate, manufactured by Teijin DuPont Film Co., Ltd., Purex film, thickness 36 μm) in the same manner so that a thickness of a resin layer after drying was 11.0 μm, and then drying was performed in a dryer at 160° C. for 5 minutes, thereby obtaining a resin sheet D with a PET film (carrier material D) for a second resin layer.

[Production Example 7]: Production of Buildup Layer A

The carrier material C and the carrier material D produced in Production Example 6 were placed on both surfaces of a glass fiber base material (thickness 15 μm, manufactured by Unitika Glass Fiber Co., Ltd., E glass fabric, E02Z 04 53SK, IPC standard 1015, coefficient of linear expansion: 5.5 ppm/° C.) so that each resin layer faced the glass fiber base material, and then the glass fiber base material was impregnated with a resin composition by a vacuum laminator and a hot air drying apparatus, thereby obtaining a buildup layer A on which a PET film was laminated.

Specifically, the carrier material C and the carrier material D were respectively superposed on both surfaces of the glass fiber base material so that the carrier material C and the carrier material D were positioned at the center in a width direction of the glass fiber base material, and bonding was performed at 80° C. using a laminate roll under a condition of reducing the pressure from normal pressure to 9.999×10$^4$ Pa (about 750 Torr) or more.

Here, in the inner region of the width direction dimension of the glass fiber base material, the resin layers of the carrier material C and the carrier material D were bonded to both surface sides of the glass fiber base material, and in the outer region of the width direction dimension of the glass fiber base material, the resin layers of the carrier material C and the carrier material D were bonded to each other.

Next, the bonded resin layers were passed through a horizontal conveyance type hot air drying apparatus set at 120° C. for 2 minutes to be heat-treated without applying pressure, thereby obtaining a buildup layer A. At this time, a thickness (C1) of the first resin layer was 18 μm, a thickness of the glass fiber base material layer was 15 μm, a thickness (C2) of the second resin layer was 7 μm, the total thickness was 40 μm, and C2/C1 was 0.39. Note that the thickness of the resin layer was measured by cutting out a cross section of the buildup layer A and observing the cut cross section with an optical microscope.

[Production Example 8] Preparation of Resin Varnish H 25 parts by weight of a novolac-type cyanate resin (Primaset PT-30, manufactured by Lonza Japan Ltd.) as the cyanate resin A, 25 parts by weight of a biphenylaralkyl-type novolac epoxy resin (NC-3000, manufactured by Nippon Kayaku Co., Ltd.) as the epoxy resin A, 10 parts by weight of the phenoxy resin having a bisphenol acetophenone structure prepared above as the phenoxy resin A, and 0.4 parts by weight of an imidazole compound (1-benzyl-2-phenylimidazole, manufactured by Shikoku Chemicals Corporation) as the curing accelerator were dissolved and dispersed in methyl ethyl ketone. Further, 20.0 parts by weight of the porous hollow resin particles (1) obtained in Production Example 1, 19 parts by weight of spherical silica (SO-32R, manufactured by Admatechs Company Limited, average particle diameter 1 μm) as the inorganic filler A, 0.2 parts by weight of γ-glycidoxypropyltrimethoxysilane (A187, manufactured by GE Toshiba Silicones Co., Ltd.) as the coupling agent A, and 0.4 parts by weight of a phthalocyanine blue/benzimidazolone/methyl ethyl ketone (=1/1/8) mixture (manufactured by Sanyo Color Works, Ltd.) as the colorant A in terms of solid content were added, stirring was performed using a high-speed stirrer for 30 minutes, and adjustment was performed so that a non-volatile content was 50% by weight, thereby preparing a resin varnish H as a varnish of a resin composition.

[Production Example 9]: Production of Carrier Materials E and F

The resin varnish H prepared in Production Example 8 was applied onto a PET film (polyethylene terephthalate, manufactured by Teijin DuPont Film Co., Ltd., Purex film, thickness 36 μm) using a die coater so that a thickness of a resin layer after drying was 14.0 μm, and then the resin layer was dried with a drying apparatus at 160° C. for 5 minutes, thereby obtaining a resin sheet E with a PET film (carrier material E) for a first resin layer. In addition, the resin varnish H prepared in Production Example 8 was applied onto a PET film (polyethylene terephthalate, manufactured by Teijin DuPont Film Co., Ltd., Purex film, thickness 36 μm) in the same manner so that a thickness of a resin layer after drying was 9.0 μm, and then drying was performed in a dryer at 160° C. for 5 minutes, thereby obtaining a resin sheet F with a PET film (carrier material F) for a second resin layer.

[Production Example 10]: Production of Solder Resist Layer A

The carrier material E and the carrier material F produced in Production Example 9 were placed on both surfaces of a glass fiber base material (thickness 15 μm, manufactured by Unitika Glass Fiber Co., Ltd., E glass fabric, E02Z 04 53SK, IPC standard 1015, coefficient of linear expansion: 5.5 ppm/° C.) so that each resin layer faced the glass fiber base material, and then the glass fiber base material was impregnated with a resin composition by a vacuum laminator and a hot air drying apparatus, thereby obtaining a solder resist layer A on which a PET film was laminated.

Specifically, the carrier material E and the carrier material F were respectively superposed on both surfaces of the glass fiber base material so that the carrier material E and the carrier material F were positioned at the center in a width direction of the glass fiber base material, and bonding was performed at 80° C. using a laminate roll under a condition of reducing the pressure from normal pressure to 9.999×10$^4$ Pa (about 750 Torr) or more.

Here, in the inner region of the width direction dimension of the glass fiber base material, the resin layers of the carrier material E and the carrier material F were bonded to both surface sides of the glass fiber base material, and in the outer region of the width direction dimension of the glass fiber base material, the resin layers of the carrier material E and the carrier material F were bonded to each other.

Next, the bonded resin layers were passed through a horizontal conveyance type hot air drying apparatus set at 120° C. for 2 minutes to be heat-treated without applying pressure, thereby obtaining a solder resist layer A. At this time, a thickness (C1) of the first resin layer was 10 μm, a thickness of the glass fiber base material layer was 15 μm, a thickness (C2) of the second resin layer was 5 μm, the total thickness was 30 μm, and C2/C1 was 0.5. Note that the thickness of the resin layer was measured by cutting out a cross section of the solder resist layer A and observing the cut cross section with an optical microscope.

[Production Example 11]: Production of Single Hollow Resin Particles (1)

1.15 g of styrene (St), 1.85 g of divinylbenzene (DVB) 810 (manufactured by NIPPON STEEL Chemical & Material Co., Ltd., a product containing 81% thereof, 19% of ethylvinylbenzene (EVB)), 2.4 g of heptane, 0.3 g of HS Crysta 4100 (side chain crystalline polyolefin, manufactured by Hokoku Corporation), 0.3 g of Blemmer 50PEP-300 (polyethylene glycol propylene glycol monomethacrylate, manufactured by NOF Corporation), and 0.099 g of LPO (trade name "Peroyl L", manufactured by NOF Corporation, 10-hour half-life temperature=61.6° C., activation energy ΔE=126.5 kJ/mol, frequency factor A=3.81×10$^{18}$ hr$^{-1}$) as an oil-soluble polymerization initiator were mixed to prepare an oil phase.

Next, 34 g of ion-exchanged water and 0.017 g of Rapisol A-80 (surfactant, manufactured by NOF Corporation) were mixed to prepare an aqueous phase.

Figure 3:
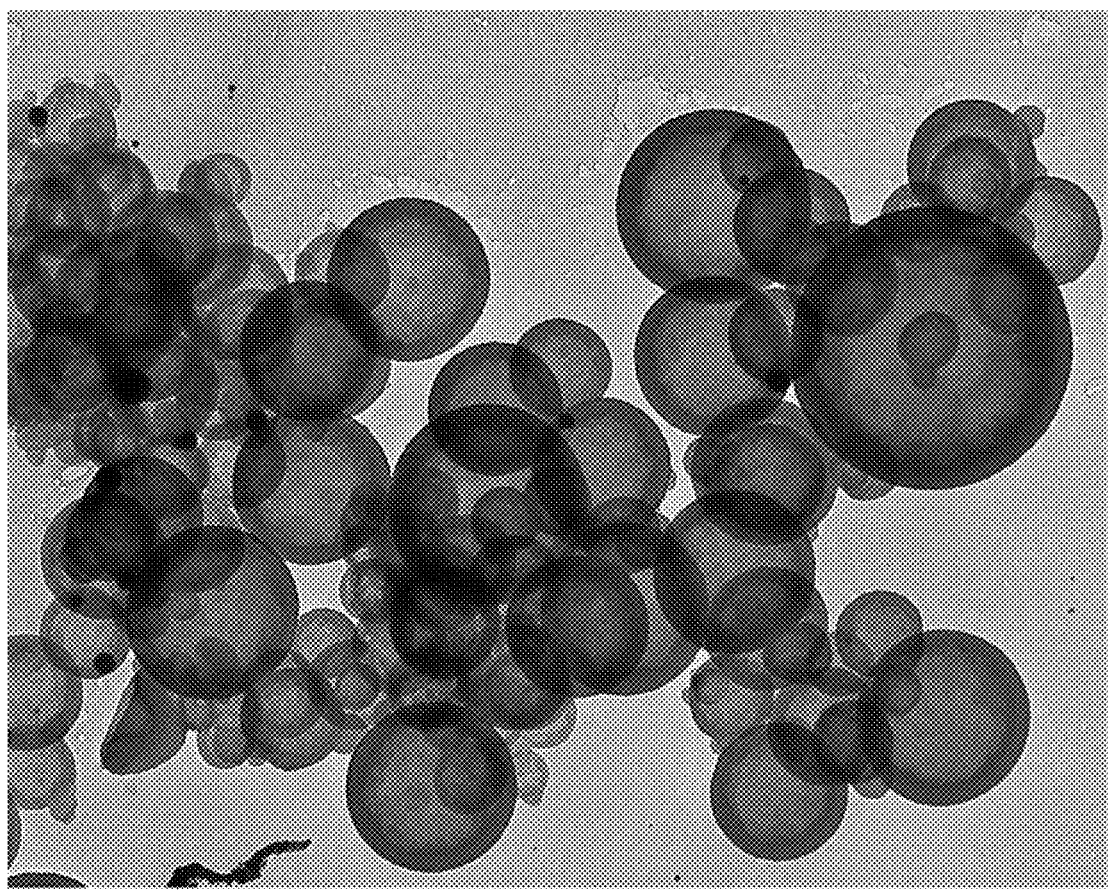
FIG. 3 is a TEM photograph of single hollow resin particles (1) obtained in Production Example 11.

The oil phase was added to the aqueous phase, and a suspension was prepared using an ultrasonic homogenizer (SONIFIER 450, manufactured by Branson Ultrasonics Corporation, conditions: Duty Cycle=50%, Output Control=5, processing time 3 minutes). The obtained suspension was heated at 70° C. for 4 hours to perform polymerization, thereby obtaining a slurry. The obtained slurry was heated at 100° C. for 24 hours to obtain hollow resin particles as a dry powder. The obtained hollow resin particles had an average particle diameter of 356 nm and a particle density of 0.65 g/cm$^3$. The TEM observation results of the obtained hollow resin particles are shown in FIG. 3. It was confirmed that the obtained hollow resin particles were single hollow resin particles (1) having a hollow surrounded by a shell.

Example 1

Two sheets of the prepregs 1 (P1) produced in Production Example 4 were laminated so that the PET films on both sides were peeled off and the first resin layers faced each other, a 12 μm copper foil (3EC-VLP foil, manufactured by Mitsui Mining & Smelting Co., Ltd.) was superposed on both surfaces of the obtained laminate, and the laminate was subjected to heating and pressure molding at 220° C. and 3 MPa for 2 hours, thereby obtaining a laminate (1) with a metal foil. The thickness of the core layer (portion formed of the laminate) of the obtained laminate (1) with a metal foil was 0.054 mm. Note that the thicknesses of the prepreg and the resin layer hardly changed before and after curing. Therefore, the core layer (portion formed of the laminate) is the total thickness of the prepreg.

Example 2

The laminate (1) with a metal foil obtained in Example 1 was used as a core substrate, and the PET film on the first resin layer side of the buildup layer A produced in Production Example 7 was peeled off to superpose the first resin layer on the front and back of the inner layer circuit board with circuit patterns formed (residual copper rate 70%, L/S=50/50 μm) on both surfaces thereof. On the other hand, vacuum heating and pressure molding were performed at a temperature of 150° C. and a pressure of 1 MPa for 120 seconds using a vacuum pressure-type laminator device. Thereafter, the PET film on the second resin layer side was peeled off by thermal curing at 220° C. for 60 minutes using a hot air drying apparatus. Next, blind via holes (non-through holes) were formed by a carbonated laser. Next, the inside of the via and the surface of the resin layer were immersed in a swelling solution (Swelling Dip Securiganth P, manufactured by Atotech Japan K.K.) at 60° C. for 5 minutes, further immersed in a potassium permanganate aqueous solution (Concentrate Compact CP, manufactured by Atotech Japan K.K.) at 80° C. for 10 minutes, and then neutralized to perform a roughening treatment.

Next, after the steps of degreasing, catalyst application, and activation, an electroless copper plating film was formed to about 0.5 μm, a plating resist was formed, the electroless copper plating film was formed into a 10 μm pattern of electroplated copper as a power supply layer, and then fine circuit processing was performed at L/S=50 μm/50 μm. Next, an annealing treatment was performed at 200° C. for 60 minutes using a hot air drying apparatus, and then the power supply layer was removed by flash etching.

Next, the PET film on the first resin layer side of the solder resist layer A produced in Production Example 10 was peeled off, the first resin layer was superposed thereon, and vacuum heating and pressure molding were performed thereon at a temperature of 150° C. and a pressure of 1 MPa for 120 seconds using a vacuum pressure-type laminator device. Thereafter, the PET film on the second resin layer side was peeled off by thermal curing at 220° C. for 60 minutes using a hot air drying apparatus. Next, blind via holes (non-through holes) were formed by a carbonated laser so that a semiconductor element mounting pad or the like was exposed.

Finally, a plating layer including a 3 μm electroless nickel plating layer formed on the circuit layer exposed from the solder resist layer A and a 0.1 μm electroless gold plating layer formed thereon was formed, and the obtained substrate was cut into a size of 50 mm×50 mm, thereby obtaining a circuit board (1) for a semiconductor package.

A semiconductor element (TEG chip, size 20 mm×20 mm, thickness 725 μm) was mounted on the circuit board (1) for a semiconductor package by thermocompression bonding using a flip chip bonder apparatus. Next, solder bumps were melt-bonded in an IR reflow furnace, and then filled with a liquid sealing resin (CRP-X4800B, manufactured by Sumitomo Bakelite Co., Ltd.), and the liquid sealing resin was cured to obtain a semiconductor package (1). Note that the liquid sealing resin was cured under a condition of a temperature of 150° C. for 120 minutes. As the solder bump of the semiconductor element, a solder bump formed of lead-free solder having a Sn/Ag/Cu composition was used.

The semiconductor package (1) was mounted on a circuit board for a semiconductor module by thermocompression bonding. Next, melt-bonding was performed using solder balls in an IR reflow furnace. As the solder ball of the semiconductor package, a solder ball formed of lead-free solder having a Sn/Ag/Cu composition was used.

Example 3

A resin varnish A' was prepared in the same manner as that of Production Example 2, except that the single hollow resin particles (1) obtained in Production Example 11 were used instead of the porous hollow resin particles (1) obtained in Production Example 1.

The resin varnish A' was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 2.83, and the dielectric loss tangent was 0.0224.

A resin sheet A' (carrier material A') with a PET film for a first resin layer and a resin sheet B' (carrier material B') with a PET film for a second resin layer were obtained in the same manner as that of Production Example 3, except that the resin varnish A' was used instead of the resin varnish A prepared in Production Example 2.

A prepreg 2 (P2) was obtained in the same manner as that of Production Example 4, except that the carrier material A' and the carrier material B' were used instead of the carrier material A and the carrier material B produced in Production Example 3, respectively.

Two sheets of the obtained prepregs 2 (P2) were laminated so that the PET films on both sides were peeled off and the first resin layers faced each other, a 12 μm copper foil (3EC-VLP foil, manufactured by Mitsui Mining & Smelting Co., Ltd.) was superposed on both surfaces of the obtained laminate, and the laminate was subjected to heating and pressing molding at 220° C. and 3 MPa for 2 hours, thereby obtaining a laminate (2) with a metal foil.

Example 4

A resin varnish G' was prepared in the same manner as that of Production Example 5, except that the single hollow resin particles (1) obtained in Production Example 11 were used instead of the porous hollow resin particles (1) obtained in Production Example 1.

The resin varnish G' was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 3.00, and the dielectric loss tangent was 0.0197.

A resin sheet C' (carrier material C') with a PET film for a first resin layer and a resin sheet D' (carrier material D') with a PET film for a second resin layer were obtained in the same manner as that of Production Example 6, except that the resin varnish G' was used instead of the resin varnish G prepared in Production Example 5.

A buildup layer A' was obtained in the same manner as that of Production Example 7, except that the carrier material C' and the carrier material D' were used instead of the carrier material C and the carrier material D produced in Production Example 6, respectively.

A circuit board (2) and a semiconductor package (2) were obtained in the same manner as that of Example 2, except that the laminate (2) with a metal foil was used instead of the laminate (1) with a metal foil and the buildup layer A' was used instead of the buildup layer A. The semiconductor package (2) was mounted on a circuit board for a semiconductor module by thermocompression bonding. Next, melt-bonding was performed using solder balls in an IR reflow furnace. As the solder ball of the semiconductor package, a solder ball formed of lead-free solder having a Sn/Ag/Cu composition was used.

Example 5

A resin varnish A" was prepared in the same manner as that of Production Example 2, except that 10.0 parts by weight of the porous hollow resin particles (1) obtained in Production Example 1 and the single hollow resin particles (1) obtained in Production Example 11 were used instead of 20.0 parts by weight of the porous hollow resin particles (1) obtained in Production Example 1.

The resin varnish A" was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 2.97, and the dielectric loss tangent was 0.0235.

A resin sheet A" (carrier material A") with a PET film for a first resin layer and a resin sheet B" (carrier material B") with a PET film for a second resin layer were obtained in the same manner as that of Production Example 3, except that the resin varnish A" was used instead of the resin varnish A prepared in Production Example 2.

A prepreg 3 (P3) was obtained in the same manner as that of Production Example 4, except that the carrier material A" and the carrier material B" were used instead of the carrier material A and the carrier material B produced in Production Example 3.

Two sheets of the obtained prepregs 3 (P3) were laminated so that the PET films on both sides were peeled off and the first resin layers faced each other, a 12 μm copper foil (3EC-VLP foil, manufactured by Mitsui Mining & Smelting Co., Ltd.) was superposed on both surfaces of the obtained laminate, and the laminate was subjected to heating and pressing molding at 220° C. and 3 MPa for 2 hours, thereby obtaining a laminate (3) with a metal foil.

Example 6

A resin varnish G" was prepared in the same manner as that of Production Example 5, except that 10.0 parts by weight of the porous hollow resin particles (1) obtained in Production Example 1 and the single hollow resin particles (1) obtained in Production Example 11 were used instead of 20.0 parts by weight of the porous hollow resin particles (1) obtained in Production Example 1.

The resin varnish G" was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 3.15, and the dielectric loss tangent was 0.0207.

A resin sheet C" (carrier material C") with a PET film for a first resin layer and a resin sheet D" (carrier material D") with a PET film for a second resin layer were obtained in the same manner as that of Production Example 6, except that the resin varnish G" was used instead of the resin varnish G prepared in Production Example 5.

A buildup layer A" was obtained in the same manner as that of Production Example 7, except that the carrier material C" and the carrier material D" were used instead of the carrier material C and the carrier material D produced in Production Example 6, respectively.

A circuit board (3) and a semiconductor package (3) were obtained in the same manner as that of Example 2, except that the laminate (2) with a metal foil was used instead of the laminate (1) with a metal foil and the buildup layer A" was used instead of the buildup layer A. The semiconductor package (3) was mounted on a circuit board for a semiconductor module by thermocompression bonding. Next, melt-bonding was performed using solder balls in an IR reflow furnace. As the solder ball of the semiconductor package, a solder ball formed of lead-free solder having a Sn/Ag/Cu composition was used.

Comparative Example 1

A resin varnish X was prepared in the same manner as that of Production Example 2, except that 20.0 parts by weight of the porous hollow resin particles (1) obtained in Production Example 1 were used, and 60.0 parts by weight of the spherical silica (SO-32R, manufactured by Admatechs Company Limited, average particle diameter 1 μm) as the inorganic filler A was used instead of 40.0 parts by weight of spherical silica (SO-32R, manufactured by Admatechs Company Limited, average particle diameter 1 μm) as the inorganic filler A.

The resin varnish X was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 3.45, and the dielectric loss tangent was 0.025.

A resin sheet P (carrier material P) with a PET film for a first resin layer and a resin sheet Q (carrier material Q) with a PET film for a second resin layer were obtained in the same manner as that of Production Example 3, except that the resin varnish X was used instead of the resin varnish A prepared in Production Example 2.

A prepreg 3 (P3) was obtained in the same manner as that of Production Example 4, except that the carrier material P and the carrier material Q were used instead of the carrier material A and the carrier material B produced in Production Example 3, respectively.

Two sheets of the obtained prepregs 3 (P3) were laminated so that the PET films on both sides were peeled off and the first resin layers faced each other, a 12 μm copper foil (3EC-VLP foil, manufactured by Mitsui Mining & Smelting Co., Ltd.) was superposed on both surfaces of the obtained laminate, and the laminate was subjected to heating and pressing molding at 220° C. and 3 MPa for 2 hours, thereby obtaining a laminate (C1) with a metal foil.

Comparative Example 2

A resin varnish Y was prepared in the same manner as that of Production Example 5, except that 20.0 parts by weight of the porous hollow resin particles (1) obtained in Production Example 1 were used, and 39.4 parts by weight of the spherical silica (SO-32R, manufactured by Admatechs Company Limited, average particle diameter 1 μm) as the inorganic filler A was used instead of 19.4 parts by weight of spherical silica (SO-32R, manufactured by Admatechs Company Limited, average particle diameter 1 μm) as the inorganic filler A.

The resin varnish Y was applied onto a PET film coated with a release agent using an applicator, the solvent in the resin composition was removed by drying, and then thermal curing was performed, thereby obtaining a film having a film thickness of 100 μm. As a result of measuring a relative dielectric constant and a dielectric loss tangent under conditions of a measurement frequency of 10 GHz and a measurement temperature of 23° C. by a cavity resonance perturbation method using a network analyzer (manufactured by Agilent Technologies, Inc.), the relative dielectric constant was 3.66, and the dielectric loss tangent was 0.022.

A resin sheet P' (carrier material P') with a PET film for a first resin layer and a resin sheet Q' (carrier material Q') with a PET film for a second resin layer were obtained in the same manner as that of Production Example 6, except that the resin varnish Y was used instead of the resin varnish G prepared in Production Example 5.

A buildup layer R was obtained in the same manner as that of Production Example 7, except that the carrier material P' and the carrier material Q' were used instead of the carrier material C and the carrier material D produced in Production Example 6, respectively.

A circuit board (C1) and a semiconductor package (C1) were obtained in the same manner as that of Example 2, except that the laminate (2) with a metal foil was used instead of the laminate (1) with a metal foil and the buildup layer R was used instead of the buildup layer A. The semiconductor package (C1) was mounted on a circuit board for a semiconductor module by thermocompression bonding. Next, melt-bonding was performed using solder balls in an IR reflow furnace. As the solder ball of the semiconductor package, a solder ball formed of lead-free solder having a Sn/Ag/Cu composition was used.

INDUSTRIAL APPLICABILITY

The laminate and the like according to the embodiments of the present invention and the circuit board including the same have excellent low dielectric property and are useful in the field of resin-sealed electronic component devices. In particular, the laminate and the like according to the embodiments of the present invention and the circuit board including the same are extremely useful in the field of electronic component devices for handling high frequency signals (for example, a frequency band of 5 GHz to 90 GHz) used in next-generation communication systems, millimeter wave radars, and the like.

The invention claimed is:
1. A laminate used for a core layer of a circuit board, wherein
the laminate does not include a buildup layer,
the laminate is obtained by laminating a plurality of prepregs including a fiber base material layer and a resin layer (A) so that the prepregs are in direct contact with each other,
the resin layer (A) contains an inorganic filler and hollow resin particles (1A),
the 1A hollow resin particles comprise at least one selected from the group consisting of hollow resin particles (1A1) having a shell portion and a hollow portion surrounded by the shell portion and hollow resin particles (1A2) having a hole portion inside each respective particle,
the 1A1 hollow resin particles are hollow resin particles in which the shell portion contains an aromatic polymer (P1) obtained by polymerizing a monomer composition containing an aromatic crosslinking monomer (a), an aromatic monofunctional monomer (b), and a (meth) acrylic acid ester-based monomer (c) represented by formula (1):

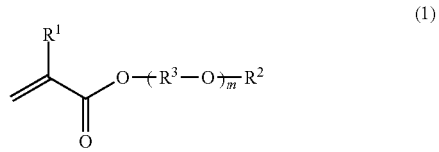

where
R$^1$ represents H or CH$_3$,
R$^2$ represents H, an alkyl group, or a phenyl group,
R$^3$—O represents an oxyalkylene group having 2 to 18 carbon atoms, and
m is an average addition molar number of the oxyalkylene group and represents an integer of 1 to 100,
the 1A2 hollow resin particles are hollow resin particles which contain a polymer (P) containing a structural unit (I) and a structural unit (II):
the structural unit (I) being at least one selected from the group consisting of structural units derived from a vinyl-based monomer, and
the structural unit (II) being derived from a phosphoric acid ester-based monomer, and
the 1A hollow resin particles are contained in the resin layer (A) in an amount of 1% by weight to 50% by weight with respect to the total amount of the resin layer (A).
2. A laminate with a buildup layer comprising the laminate according to claim 1, and a buildup layer including a fiber base material layer and a resin layer (B) which is provided on at least one surface of the laminate, wherein
the resin layer (B) contains an inorganic filler and hollow resin particles (1B),
the 1B hollow resin particles comprise at least one selected from the group consisting of hollow resin particles (1B1) having a shell portion and a hollow portion surrounded by the shell portion and hollow resin particles (1B2) having a hole portion inside each respective particle,
the 1B1 hollow resin particles are hollow resin particles in which the shell portion contains an aromatic polymer (P1) obtained by polymerizing a monomer composition containing an aromatic crosslinking monomer (a), an aromatic monofunctional monomer (b), and a (meth) acrylic acid ester-based monomer (c) represented by formula (1):

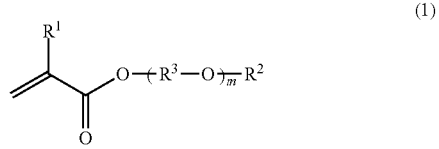

where
- $R^1$ represents H or $CH_3$,
- $R^2$ represents H, an alkyl group, or a phenyl group,
- $R^3$—O represents an oxyalkylene group having 2 to 18 carbon atoms, and
- m is an average addition molar number of the oxyalkylene group and represents an integer of 1 to 100, the 1B2 hollow resin particles are the hollow resin particles which contain a polymer (P) containing a structural unit (I) and a structural unit (II):
- the structural unit (I) being at least one selected from the group consisting of structural units derived from a vinyl-based monomer, and
- the structural unit (II) being derived from a phosphoric acid ester-based monomer, and the 1B hollow resin particles are contained in the resin layer (B) in an amount of 1% by weight to 50% by weight with respect to the total amount of the resin layer (B).

3. A laminate with a metal foil, wherein the metal foil is formed on at least one surface of the laminate according to claim 1.

4. A circuit board comprising the laminate according to claim 1.

5. A laminate with a metal foil, wherein the metal foil is formed on at least one surface of the laminate with a buildup layer according to claim 2.

6. A circuit board comprising the laminate with a buildup layer according to claim 2.

7. A circuit board comprising the laminate with a metal foil according to claim 3.

8. A circuit board comprising the laminate with a metal foil according to claim 5.

9. The laminate according to claim 1, wherein the 1A1 hollow resin particles are contained in the resin layer (A) in an amount of 1% by weight to 50% by weight with respect to the total amount of the resin layer (A).

10. The laminate according to claim 1, wherein the 1A2 hollow resin particles are contained in the resin layer (A) in an amount of 1% by weight to 50% by weight with respect to the total amount of the resin layer (A).

* * * * *